(12) United States Patent
Large et al.

(10) Patent No.: US 10,886,498 B2
(45) Date of Patent: Jan. 5, 2021

(54) MOVEABLE DISPLAY SUPPORTS, COMPUTING DEVICES USING SAME, AND METHODS OF USE

(71) Applicant: Microsoft Technology Licensing, LLC, Redmond, WA (US)

(72) Inventors: Timothy Andrew Large, Bellevue, WA (US); Lincoln Matthew Ghioni, Redmond, WA (US); Sarat Babu, London (GB); Matthew James Longbottom, London (GB); Duncan Alexander Wallis Carter, London (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 18 days.

(21) Appl. No.: 15/832,639

(22) Filed: Dec. 5, 2017

(65) Prior Publication Data
US 2019/0173041 A1    Jun. 6, 2019

(51) Int. Cl.
*G06F 1/16* (2006.01)
*H05K 5/00* (2006.01)
*H05K 7/00* (2006.01)
*H01L 51/52* (2006.01)
*H01L 51/56* (2006.01)
(Continued)

(52) U.S. Cl.
CPC .......... *H01L 51/524* (2013.01); *G06F 1/1652* (2013.01); *G06F 1/1681* (2013.01); *H01L 51/0097* (2013.01); *H01L 51/56* (2013.01); *H04M 1/0216* (2013.01); *H04M 1/0268* (2013.01); *H01L 2251/5338* (2013.01)

(58) Field of Classification Search
CPC . G06F 1/1652; H01L 51/524; H01L 51/0097;
H01L 51/56
USPC ............... 361/679.03, 679.26, 679.3, 679.56
See application file for complete search history.

(56) References Cited

U.S. PATENT DOCUMENTS

| | | | |
|---|---|---|---|
| 2015/0131222 A1 | 5/2015 | Kauhaniemi et al. | |
| 2015/0169006 A1* | 6/2015 | Chong | G09G 3/20 345/173 |

(Continued)

FOREIGN PATENT DOCUMENTS

| | | |
|---|---|---|
| CN | 206309761 U | 7/2017 |
| CN | 206559426 U | 10/2017 |

(Continued)

OTHER PUBLICATIONS

"OLED Association", Retrieved from<<http://www.oled-a.org/>>, Retrieved on: Nov. 8, 2017, 25 Pages.

(Continued)

*Primary Examiner* — Anthony M Haughton
(74) *Attorney, Agent, or Firm* — Ray Quinney & Nebeker P.C.; Paul N. Taylor

(57) ABSTRACT

A computing device is disclosed that includes an organic light-emitting diode (OLED) display. The OLED display has a front surface and a back surface. The computing device includes a moveable display support connected to the back surface of the display. In some implementations, the moveable display support is configured to limit bending in one direction to a first bend radius and to limit bending in another direction to a second bend radius. In some implementations, the moveable display support is formed by a plurality of unit cells.

22 Claims, 15 Drawing Sheets

(51) Int. Cl.
*H01L 51/00* (2006.01)
*H04M 1/02* (2006.01)

(56) References Cited

U.S. PATENT DOCUMENTS

| | | | |
|---|---|---|---|
| 2016/0164852 A1* | 6/2016 | McCoy | H04L 9/3226 713/168 |
| 2016/0195901 A1 | 7/2016 | Kauhaniemi et al. | |
| 2016/0370828 A1* | 12/2016 | Hsu | G06F 1/1681 |
| 2017/0023986 A1 | 1/2017 | Xin et al. | |
| 2017/0048996 A1 | 2/2017 | Han et al. | |
| 2017/0061836 A1 | 3/2017 | Kim et al. | |
| 2018/0150107 A1 | 5/2018 | Lee et al. | |
| 2019/0196541 A1 | 6/2019 | O'neil et al. | |

FOREIGN PATENT DOCUMENTS

| | | |
|---|---|---|
| EP | 2728433 A1 | 5/2014 |
| EP | 2874043 A1 | 5/2015 |

OTHER PUBLICATIONS

Humphries, Matthew, "Lenovo Demos Folio Folding Tablet", Retrieved from<<http://in.pcmag.com/lenovo-1/115881/news/lenovo-demos-folio-folding-tablet>>, Jul. 25, 2017, 4 Pages.

"International Search Report and Written Opinion Issued in PCT Application No. PCT/US18/062374", dated Feb. 27, 2019, 11 Pages.

"International Search Report and Written Opinion Issued in PCT Application No. PCT/US2018/063505", dated Mar. 15, 2019, 21 Pages.

"Final Office Action Issued in U.S. Appl. No. 15/853,536", dated Dec. 20, 2019, 14 Pages.

"Non-Final Office Action Issued in U.S. Appl. No. 15/853,536", dated Jun. 13, 2019, 11 Pages.

"Non Final Office Action Issued in U.S. Appl. No. 15/853,536", dated Apr. 16, 2020, 13 Pages.

"Final Office Action Issued in U.S. Appl. No. 15/853,536", dated Oct. 22, 2020, 15 Pages.

* cited by examiner

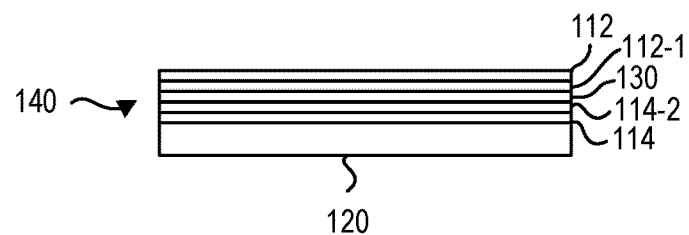
FIG. 3
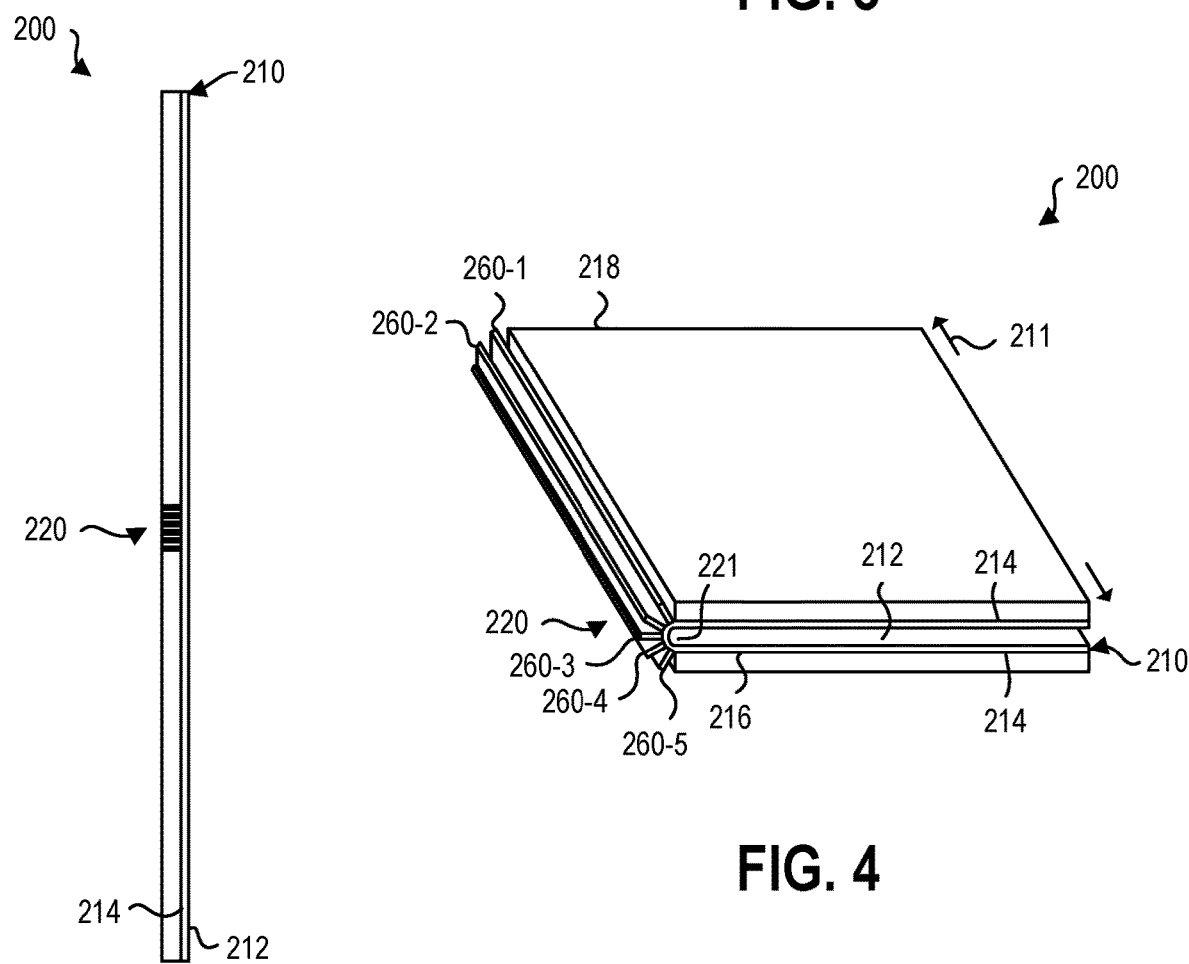
FIG. 4
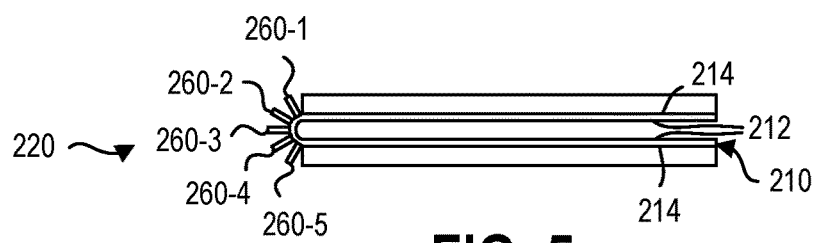
FIG. 5
FIG. 6

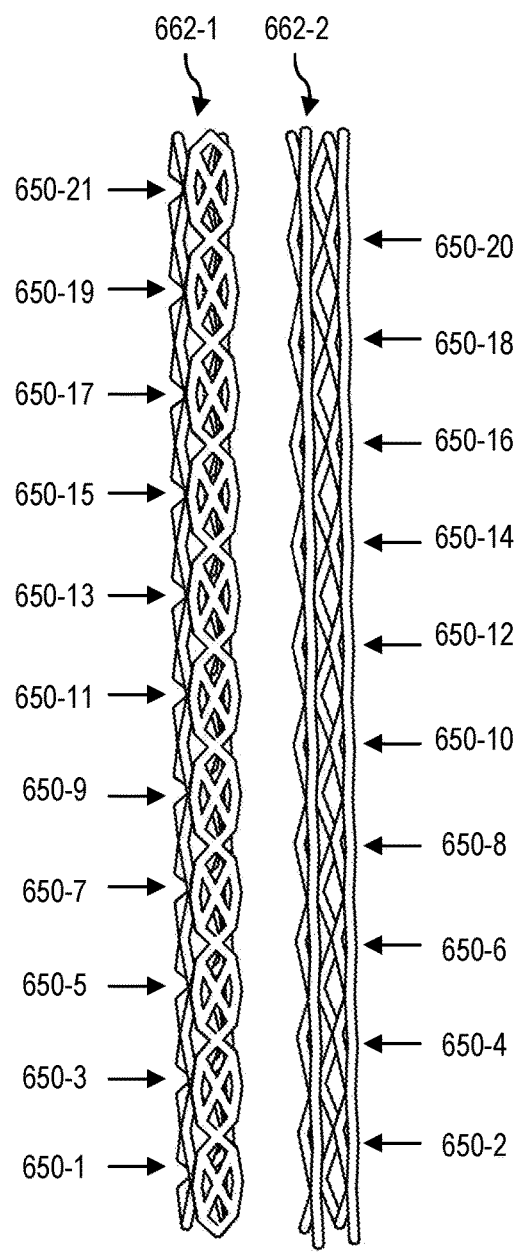
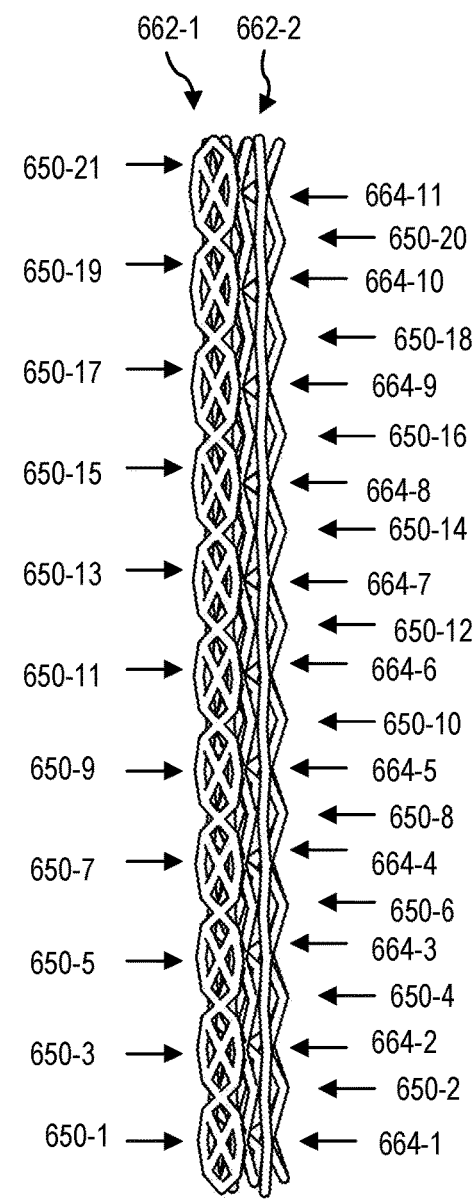
FIG. 28    FIG. 29

MOVEABLE DISPLAY SUPPORTS, COMPUTING DEVICES USING SAME, AND METHODS OF USE

BACKGROUND

Background and Relevant Art

Use of computing devices is becoming more ubiquitous by the day. Computing devices range from standard desktop computers to wearable computing technology and beyond. One area of computing devices that has grown in recent years is flexible displays. Flexible displays may be moved to a bent configuration. Flexible screens may be fragile.

The subject matter claimed herein is not limited to implementations that solve any disadvantages or that operate only in environments such as those described above. Rather, this background is only provided to illustrate one exemplary technology area where some implementations described herein may be practiced.

BRIEF SUMMARY

In one implementation, a computing device is described. The computing device includes a flexible display including a thin film transistor matrix having a front surface and a back surface. A moveable display support is included and is connected to the back surface of the display and is configured to limit bending in one direction to a first bend radius while maintaining strain on the thin film transistor matrix below a predetermined amount of strain by elongating the moveable display support during bending.

In another implementation, a computing device is described. The computing device includes a flexible display having a front surface and a back surface. The computing device includes a moveable display support connected to the back surface of the display. The moveable display support is formed by a plurality of unit cells.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims, or may be learned by the practice of the disclosure as set forth hereinafter.

BRIEF DESCRIPTION OF THE DRAWINGS

To describe the way the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 3 is a cutaway side view of the computing device of FIG. 1;

FIG. 4 is an isometric view of another implementation of a computing device in a bent configuration;

FIG. 5 is a side view of the computing device of FIG. 4 in a bent configuration;

FIG. 6 is a side view of the computing device of FIG. 4 in a planar configuration;

FIG. 28 is a top view of a plurality of separated rows of unit cells in the planar configuration;

FIG. 29 is a top view of a plurality of interconnected rows of unit cells in the planar configuration;

DETAILED DESCRIPTION

Figure 1:
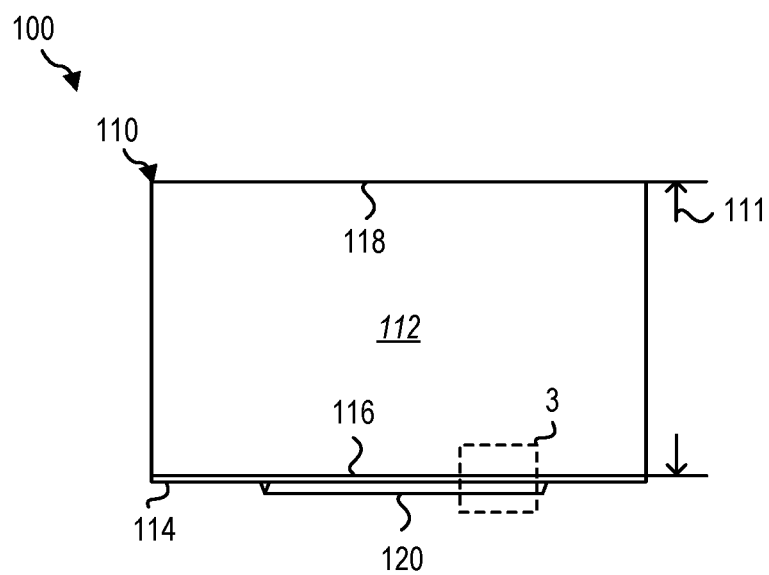
FIG. 1 is a perspective top view of an implementation of a computing device in a planar configuration.

This disclosure generally relates to moveable display supports, computing devices using the same, and methods of use. More particularly, this disclosure generally relates to moveable display supports that are connected to a back surface of flexible light emitting displays such as organic light-emitting diode (OLED) displays or micro-LED displays.

As displays continue to get thinner, the risk of damaging the display increases. For example, the outer surface of a display may be soft, which may increase the risk of scratches. In another example, a display may not completely support the display and softer materials, such as foams, may be used to provide some support. However, these softer materials, may still allow for damage from bending beyond a minimum bend radius and/or normal loads. This often results in layers that are compressible which may make the display susceptible to point loads (e.g., finger-nails, digitizer pen tips, particles of dust) that may locally exceed a minimum bend radius of the display, which may result in the destruction of small areas of pixels. A minimum bend radius may include the minimum radius to which a display may be bent without destroying pixels.

Folding displays may also include the risk of damaging the display. Typically, foldable displays have a complex structure of (mostly plastic) layers. An electrode structure may be included in and/or near the middle and may include a water barrier layer on either side. The electrode structure and/or water barrier layers are typically inorganic and may crack when an applied stress (e.g., pressure or tension exerted on a material object) places the electrode structure and/or water barrier layers under strain (e.g., distortion of a material object caused by application of stress). The layers of a foldable display may form a stack. In at least some implementations, it may be desirable that the electrode structure should have as close to zero strain as possible. For example, when a display is folded beyond a minimum bend radius, plasticity (e.g., tendency to retain permanent deformation after application of stress) in the layers tends to retain the fold, which may result in buckling and/or creasing of the display surface. In some instances, this buckling and/or creasing may cause the display to extend above a chassis of the display. It may therefore be desirable to affix the display to a structure, to limit long term plastic deformation.

Fixing a display to a hard backing surface (e.g., a planar hard piece of plastic) may reduce risk of damage to the display until stress applied to the display exceeds the strain tolerance of the hard surface. However, for a foldable display, the hard backing surface may limit the ability of the display to fold. For example, a hard and thick sheet of plastic attached to a back surface of a foldable display may have a very large bend radius, which may significantly limit the bendability of the foldable display. Furthermore, such a large and thick sheet will have a neutral plane (zero strain layer) inside the sheet, so that when the assembly is folded, the display affixed to the external surface will suffer severe strain.

In at least one implementation, a moveable display support affixed to a display may be capable of supporting high normal loads while allowing the display to globally fold along a pre-determined path with low internal strain in the display. In at least one implementation, a moveable display support may facilitate curvature over a pre-defined radius without exceeding the pre-defined radius and/or providing support against point loads.

In at least one implementation, the moveable display support may provide added stiffness to resist normal forces. In at least one implementation, the moveable display support expands along its length when rolled to maintain the zero-strain condition of the display. In at least one implementation, a computing device may be capable of resisting point loads of less than 500 grams over a 0.39 mm$^2$ area. In at least one implementation, the moveable display support includes elements that are linked like chain mail with particular bends to limit motion in two directions.

A display may have a theoretical zero-strain plane that extends through the transistor layer of the display. The zero-strain plane has a theoretical thickness of zero. In the real world, maintaining the display with near zero-strain may include preventing the application of more than a predetermined amount of strain. In at least one implementation, a moveable display support may prevent the display from experiencing more than a predetermined amount of strain. In some implementations, the predetermined amount of strain may be in a range having an upper value, a lower value, or upper and lower values including any of less than 2.0%, less than 1.5%, less than 1.0%, less than 0.75%, less than 0.50%, less than 0.25%, less than 0.10%, less than 0.05%, or any value therebetween. For example, the predetermined amount of strain may be less than 2.0%. In other examples, the predetermined amount of strain may be less than 1.0%. In further examples, the predetermined amount of strain may be less than 0.50%. In yet other examples, the predetermined amount of strain may be in a range of 0.05% to 2.0%. In yet further examples, the predetermined amount of strain may be in a range of 0.05% to 1.5%.

Figure 2:
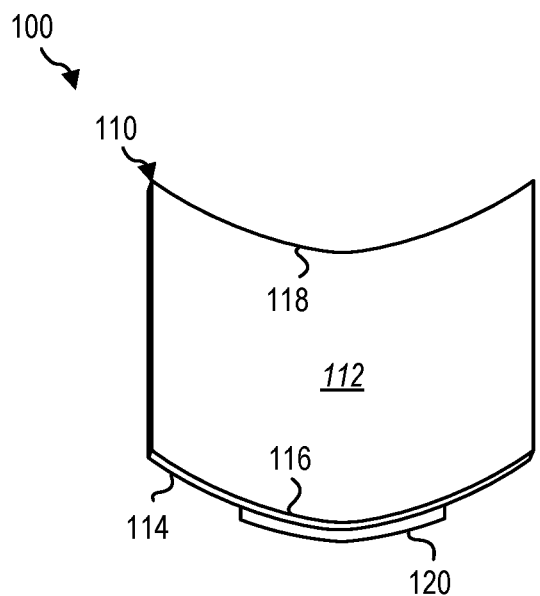
FIG. 2 is perspective top view of the computing device of FIG. 1 in a bent configuration.

FIG. 1 is a perspective top view of an implementation of a computing device 100 in a planar configuration. FIG. 2 is perspective top view of the computing device 100 of FIG. 1 in a bent configuration. Referring generally now to FIGS. 1 and 2 (and specifically as indicated). The computing device 100 may be a laptop, a smartphone, a monitor (e.g., a television, desktop computer monitor, an interactive white board, or other display), a watch display, an electronic reading device, or other computing devices with a display.

The computing device 100 may include a flexible display 110 and a moveable display support 120. The display 110 may be an OLED display that may include a thin film transistor matrix. In other examples, the flexible display 110 may include a micro LED display, a LCD display, an electrophoretic display, other flexible displays, or combinations thereof. The display 110 may have a minimum bend radius without additional support.

The display 110 is flexible and may be biased toward the planar configuration shown in FIG. 1. The display 110 may be bent from the planar configuration of FIG. 1 to a bent configuration, such as the bent configuration shown in FIG. 2. As described above, bending a display 110 beyond a predetermined minimum bend radius may damage the display 110. The moveable display support 120 may limit the amount that the display 110 may bend. For example, as shown in FIG. 2, the moveable display support 120 limits the moveable display support 120 to a radius of, for example, 3 millimeters (mm).

The display 110 may include a front surface 112 and a back surface (not shown). The moveable display support 120 may be connected to the back surface of the display 110. For example, the moveable display support 120 may be attached (e.g., adhered, affixed, mechanically connected) to the back surface of the display 110. In some implementations, the moveable display support 120 may be attached to the entire back surface of the display 110. In other implementations, the moveable display support 120 may include attachment points that are spaced about the back surface of the display 110. For example, the attachment points may be spaced such that the display 110 is capable of withstanding applied normal forces above a predetermined amount. Supporting the display 110 may provide the support necessary to prevent point load damage to the display 110.

In some implementations, the moveable display support 120 may limit motion (e.g., bending) in one direction to a first bend radius and/or may limit bending in another direction to a second bend radius. For example, in the implementation of FIGS. 1 and 2, the moveable display support 120 may limit bending about the back surface of the display 110 to a first bend radius of infinity and may limit bending about the front surface 112 of the display 110 to a second bend radius of 3 mm. In other words, the moveable display support 120 may limit bending about the back surface 114 of the display 110 such that the back surface 114 remains planar (e.g., does not bend to a concave shape) in a first configuration and may bend to the second bend radius of 3 mm (e.g., bent to a concave shape having a bend radius of 3 mm).

In other implementations, the first bend radius may be in a range having an upper value, a lower value, or upper and lower values including any of infinity, 10 mm, 5 mm, 4.5 mm, 4 mm, 3.5 mm, 3 mm, 2.5 mm, 2 mm, 1.5 mm, 1 mm, 0.5 mm, or any value therebetween. For example, the first bend radius may be infinity (e.g., may remain flat). In other examples, the first bend radius may be less than 10 mm. In further examples, the first bend radius may be greater than 0.5 mm. In yet other examples, the first bend radius may be in a range of 0.5 mm to 10 mm. In yet further examples, the first bend radius may be in a range of 0.5 mm to 10 mm and/or infinity.

In other implementations, the second bend radius may be in a range having an upper value, a lower value, or upper and lower values including any of infinity, 2,000 mm, 1,500 mm, 1,000 mm, 500 mm, 250 mm, 100 mm, 50 mm, 25 mm, 10 mm, 5 mm, 4.5 mm, 4 mm, 3.5 mm, 3 mm, 2.5 mm, 2 mm, 1.5 mm, 1 mm, 0.5 mm, or any value therebetween. For example, the second bend radius may be infinity (e.g., may remain flat). In other examples, the second bend radius may be less than 5 mm. In further examples, the second bend radius may be greater than 0.5 mm. In yet other examples, the second bend radius may be in a range of 0.5 mm to 4 mm. In yet further examples, the second bend radius may be in a range of 1,000 mm to infinity.

Therefore, the first bend radius and the second bend radius may be selected to determine a first configuration and a second configuration. For example, the first configuration may be planar (e.g., with an infinite first bend radius) and the second configuration may curved with, in some implementations, a second bend radius of less than 4 mm. In another example, the first configuration may be curved such that the front surface 112 is concave and may have a first bend radius of less than 4 mm and the second configuration may be curved such that the back surface is concave and may have a second bend radius of less than 4 mm.

The first and/or second bend radius may be selected to prevent bending of the display 110 beyond a first and/or second maximum bend radius. For example, the maximum bend radius of a display 110 may be 3 mm and the first and/or second bend radius of the moveable display support 120 may be greater than the maximum bend radius of the display (e.g., greater than 3 mm). Example moveable display supports are provided below.

Although bend radii are described above as applying to the bending of the entire display 110, bend radii are also applicable for point or other normal loads applied to a surface of the display 110. For example, if a stylus (not shown) were pressed against the display, the moveable display support 120 may provide support to the display 110 to prevent the transistor layer exceeding a minimum bend radius (e.g., preventing the stylus from puncturing the display 110). This support may be provided in a planar state, a bent state, an intermediate state, or combinations thereof.

The display 110 may have a dimension 111. As shown, the dimension 111 is a width. In other implementations, the dimension 111 may be a length, a diagonal, a perimeter, a radius, a diameter, or other major dimension. The dimension 111 may extend from a first edge 116 to a second edge 118 of the display 110. The moveable display support 120 may extend between the first edge 116 and the second edge 118 of the display 110.

The moveable display support 120 may have a dimension (not labeled) that corresponds with the dimension 111 of the display 110. As shown, the dimension of the moveable display support 120 is the width of the moveable display support 120. In another example, if the dimension 111 of the display 110 is the length, then the dimension of the moveable display support 120 is also the length, etc. The dimension of the moveable display support 120 (e.g., width), in the present implementation, is the same as the dimension 111 of the display 110. In other words, the width of the display 110 and the width of the moveable display support 120 are the same. In other implementations, the dimension of the moveable display support 120 may be smaller than the dimension 111 of the display 110.

For example, the dimension of the moveable display support 120 may be a portion of the dimension 111. In other implementations, the dimension of the moveable display support 120 may be a percentage of the dimension 111 in a range having an upper value, a lower value, or upper and lower values including any of within 75%, 80%, 85%, 90%, 95%, 97.5%, 98%, 98.5%, 99%, 99.5%, 99.75%, 99.9%, 99.95% of the dimension 111 of the display 110, or any value therebetween. For example, the distance may be less than 99.95% of the dimension. In other examples, the distance may be greater than 0.05% of the dimension 111. In yet other examples, the distance may be in a range of 25% to 0.05% of the dimension 111.

In implementations where the dimension of the moveable display support 120 is smaller than the dimension 111 of the display 110, the moveable display support 120 may extend within 5% of the dimension 111 to the first edge 116 and/or the second edge 118 of the display 110. In other words, the distance between an edge (not shown) of the moveable display support 120 and the first edge 116 and/or second edge 118 of the display may be less than 5% of the dimension 111 of the display. In other implementations, the distance may be in a range having an upper value, a lower value, or upper and lower values including any of within 25%, 20%, 15%, 10%, 7.5%, 5%, 3%, 2%, 1%, 0.5%, 0.25%, 0.1%, 0.05% of the dimension 111 of the display 110, or any value therebetween. For example, the distance may be less than 25% of the dimension. In other examples, the distance may be greater than 0.05% of the dimension 111. In yet other examples, the distance may be in a range of 25% to 0.05% of the dimension 111.

As shown, the front surface 112 of the display 110 may be entirely unobstructed. In other words, the front surface 112 is the outermost surface on the front side of the display 110. In other implementations, a portion of the front surface 112 may be obstructed. For instance, a cover (not shown) may extend partially around the front surface 112. In some implementations, a majority of the front surface 112 may be unobstructed.

FIG. 3 is a cutaway side view of the computing device of FIG. 1 illustrating a display stack 140. The stack 140 may include the front surface 112 and the back surface 114 of the display 110. The stack 140 may include a display layer 130. The display layer 130 may be surrounded by one or more front layers (including the front surface 112) and is shown with the front layer (the frontmost layer including the front surface 112) and a second front layer 112-1 and/or one or more back layers (including the back surface 114) and is shown with the back layer (the backmost layer including the back surface 114) and a second back layer 114-1.

In some implementations, the display layer 130 may be an OLED layer and may include a thin film transistor matrix. The second front layer 112-1 and/or the second back layer 114-1 may be barrier layer(s).

FIG. 4 is an isometric view of another implementation of a computing device 200 in a bent configuration; FIG. 5 is a side view of the computing device 200 of FIG. 4 in the bent configuration; and FIG. 6 is a side view of the computing device 200 of FIG. 4 in a planar configuration. Referring generally to FIGS. 4-6, unless otherwise specified, the computing device 200 includes a display 210 and a moveable display support 220. The display 210 includes a front surface 212 and a back surface 214. The moveable display support 220 may be connected to the back surface 214 of the display 210. The moveable display support 220 is shown extending a full length (e.g., from the first edge 216 to the second edge 218) of the display 210.

As shown in FIG. 6, the front surface 212 of the display 210 is unobstructed and as shown in FIG. 4, the front surface 212 is only obstructed by another portion of the front surface 212.

The moveable display support 220 may include a plurality of support elements 260. As shown, the moveable display support 220 includes five support elements 260-1, 260-2, 260-3, 260-4, 260-5. The support elements 260 may cooperate to limit bending about the back surface 214 of the display 210.

As shown, the support elements 260 limit bending about the back surface 214 of the display 210 to an infinite bend radius (e.g., planar). However, the support elements 260 are not capable of limiting movement of the display 210 beyond a radius of curvature 221, as shown in FIG. 4. Specifically, as the display 210 bends, the portions of the support elements 260 that contact, in some implementations are attached to, the display 210, retain their same individual geometry in both the planar and bent configurations. In other words, the first support element 260-1 (and/or any other support elements 260) does not change in length (in the direction of the bending). Thus, while capable of limiting motion of the display 210 to prevent exceeding a first bend radius (e.g., the infinite bend radius of FIG. 6), the implementation of a moveable display support 220 in FIGS. 4-6 is not capable of limiting motion of the display 210 to prevent exceeding a second bend radius (e.g., bend radius 221 of FIGS. 4-5).

Figure 7:
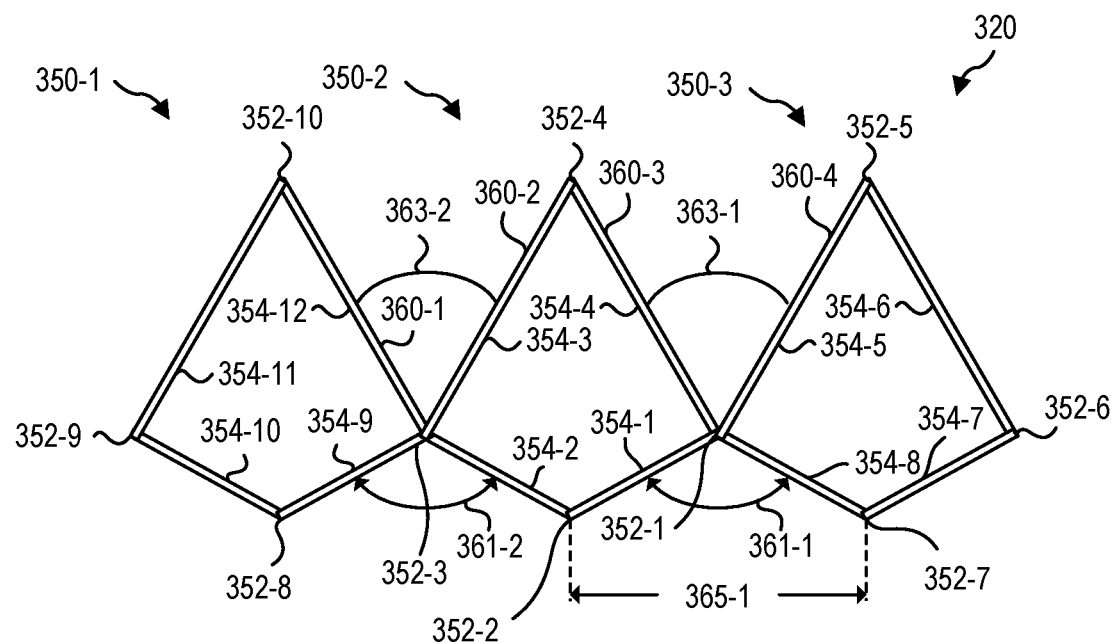
FIG. 7 is a partial side view of an implementation of a moveable display support in a planar configuration.
Figure 9:
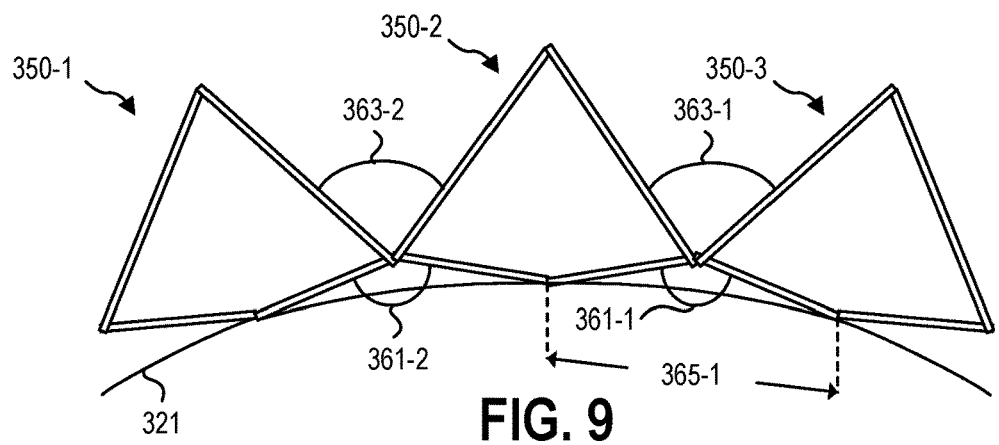
FIG. 9 is a partial side view of the moveable display support of FIG. 7 in a bent configuration.

FIG. 7 is a partial side view of an implementation of a moveable display support 320 in a planar configuration and FIG. 9 is a partial side view of the moveable display support 320 of FIG. 7 in a bent configuration. Referring generally to FIGS. 7 and 9, the moveable display support 320 may move between and/or to the planar configuration of FIG. 7 and the bent configuration of FIG. 9.

The moveable display support 320 includes a plurality of support elements 360. The support elements 360 may interlock. The plurality of support elements 360 may cooperate to form interlocking unit cells 350. The support elements 360 may include a plurality of pivots 352 and a plurality of links 354.

As shown, the moveable display support 320 includes three interlocking unit cells 350-1, 350-2, 350-3. The first unit cell 350-1 may be connected to the second unit cell 350-2 by the third link 352-3. The second unit cell 350-2 may be connected to the third unit cell 350-3 by the first link 352-1.

The first unit cell 350-1 is formed by ninth link 354-9, tenth link 354-10, eleventh link 354-11, and twelfth link 354-12. Ninth link 354-9 is connected to tenth link 354-10 by eighth pivot 352-8, tenth link 354-10 is connected to eleventh link 354-11 by ninth pivot 352-9, eleventh link 354-11 is connected to twelfth link 354-12 by tenth pivot 352-10, and twelfth link 354-12 is connected to ninth link 354-9 by third pivot 352-3.

The second unit cell 350-2 is formed by first link 354-1, second link 354-2, third link 354-3, and fourth link 354-4. First link 354-1 is connected to second link 354-2 by second pivot 352-2, second link 354-2 is connected to third link 354-3 by third pivot 352-3, third link 354-3 is connected to fourth link 354-4 by fourth pivot 352-4, and fourth link 354-4 is connected to first link 354-1 by first pivot 352-1.

The third unit cell 350-3 is formed by fifth link 354-5, sixth link 354-6, seventh link 354-7, and eighth link 354-8. Fifth link 354-5 is connected to sixth link 354-6 by fifth pivot 352-5, sixth link 354-6 is connected to seventh link 354-7 by sixth pivot 352-6, seventh link 354-7 is connected to eighth link 354-8 by seventh pivot 352-7, and eighth link 354-8 is connected to fifth link 354-5 by first pivot 352-1.

Figure 8:
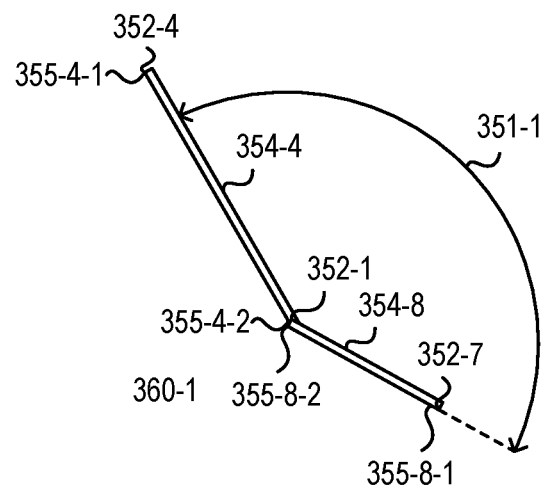
FIG. 8 is a side view of an implementation of an interlocking element of FIG. 7.

FIG. 8 is a side view of an implementation of a support element 360-1 of FIG. 7. The support element 360-1 may include the first pivot 352-1, the fourth pivot 352-4, and the seventh pivot 352-7. The support element 360-1 includes the fourth link 354-4 and the eighth link 354-8. The fourth link 354-4 extends from a first end 355-4-1 to a second end 355-4-2. The eighth link 354-8 extends from a first end 355-8-1 to a second end 355-8-2.

The fourth link 354-4 and the eighth link 354-8 are directly connected to each other such that the angle 351-1 between the fourth and eighth links 354-4, 354-8 does not change. The angle 351-1 may be determined to control angles 361, 363 (shown in FIGS. 7 and 9) between unit cells 350.

As shown in FIG. 9, the unit cells 350 create a radius of curvature 321 in the bent configuration. The angles 351, 361, 363 may vary. In at least one implementation, in the planar configuration, the angle 351 may be 150 degrees, the angle 361 may be 90 degrees, and the angle 363 may be 81 degrees. As shown in FIG. 7, in the planar configuration, the angle 361-1 between the second unit cell 350-2 and the third unit cell 350-3 is larger than the angle 363-3 between the second unit cell 350-2 and the third unit cell 350-3.

Figure 10:
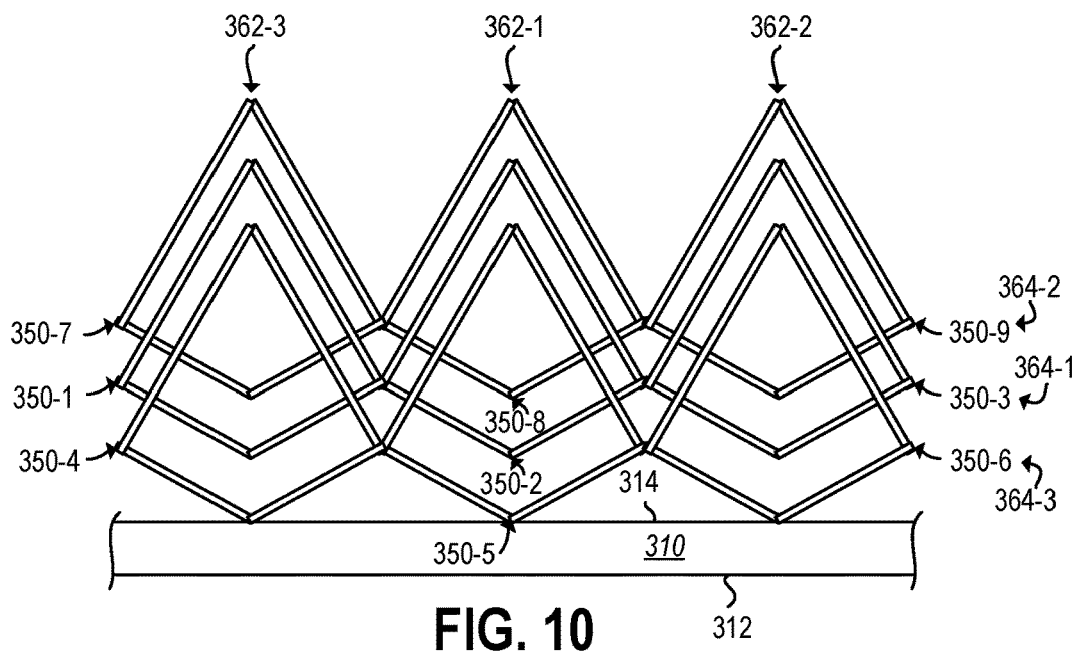
FIG. 10 is a perspective side view of the moveable display support of FIG. 7 in the planar configuration.
Figure 11:
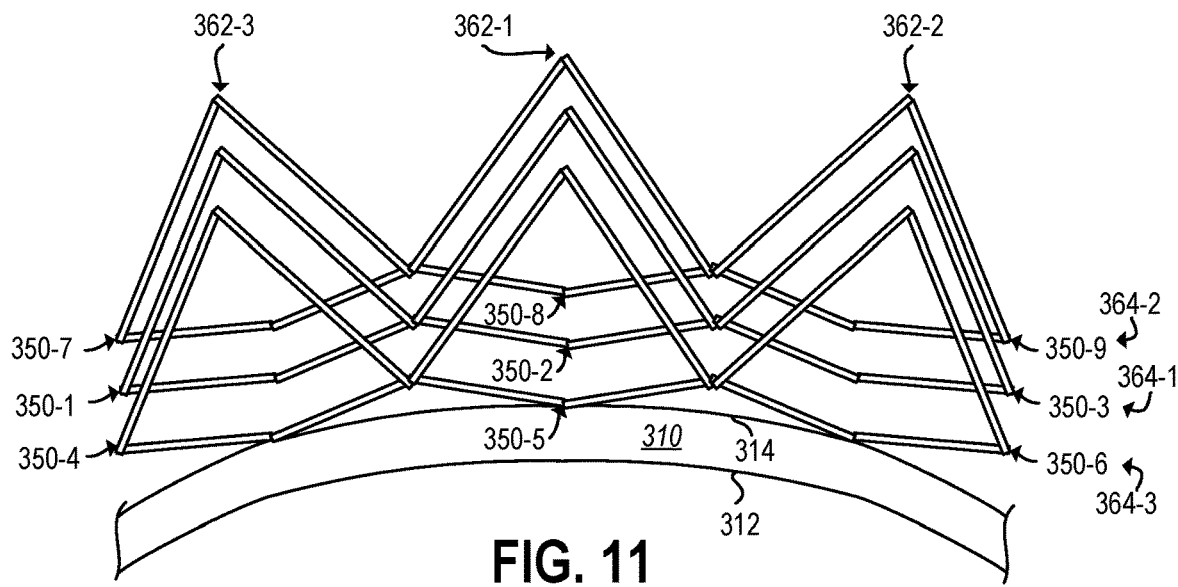
FIG. 11 is a perspective side view of the moveable display support of FIG. 7 in the bent configuration.

Unlike the moveable display support 220 of the implementation of FIGS. 4-6, the implementation of the moveable display support 320 of FIGS. 7 and 9 (and FIGS. 10 and 11) may be capable of limiting motion of the display 310 (shown in FIGS. 10 and 11) to prevent exceeding a first bend radius (e.g., the infinite bend radius of FIGS. 7 and 10), and may be capable of limiting motion of the display 310 to prevent exceeding a second bend radius (e.g., bend radius 321 shown in the bent configurations of FIGS. 9 and 11). The ability to limit motion of the display 310 in two directions without exceeding one or more bend radii of the display may be accomplished by using support elements (e.g., support elements 360) and/or unit cells (e.g., unit cells 350) that elongate during the bending process. In other words, a distance 365-1 between the second pivot 352-2 and the seventh pivot 452-7 may elongate from the first (e.g., planar) configuration to the second (e.g., bent configuration). In another example, as the moveable display support 320 transitions from the planar configuration of FIG. 7 to the bent configuration of FIG. 9, the angles 361-1 and 363-1 between the second and third unit cell 350-2, 350-3 may increase.

FIG. 10 is a perspective side view of the moveable display support 320 of FIG. 7 in the planar configuration and FIG. 11 is a perspective side view of the moveable display support 320 of FIG. 7 in the bent configuration. As shown, the moveable display support 320 may be connected (e.g., adhered, affixed, mechanically connected) to the back surface of the display 310.

As shown in FIGS. 10 and 11, unit cells 350 may be form rows 362 and columns 364. For example, unit cells 350-1, 350-2, 350-3 form column 364-1 and unit cells 350-2, 350-5, 350-8 form row 362-1. The rows 362 may move together between configurations. For example, a pin may extend through multiple pivots 352 in a row 362. In another example, flexures may act as pivots 352.

The moveable display support 320 may bend parallel to one or more rows 362. In other words, the moveable display support 320 may act as a hinge. In some implementations, the moveable display support 320 may only bend parallel to one or more rows 362. In other implementations, the moveable display support 320 may bend transversely to one or more rows 362. For instance, the moveable display support 320 may bend about lines and/or curves that are not parallel to one or more rows 362.

Figure 12:
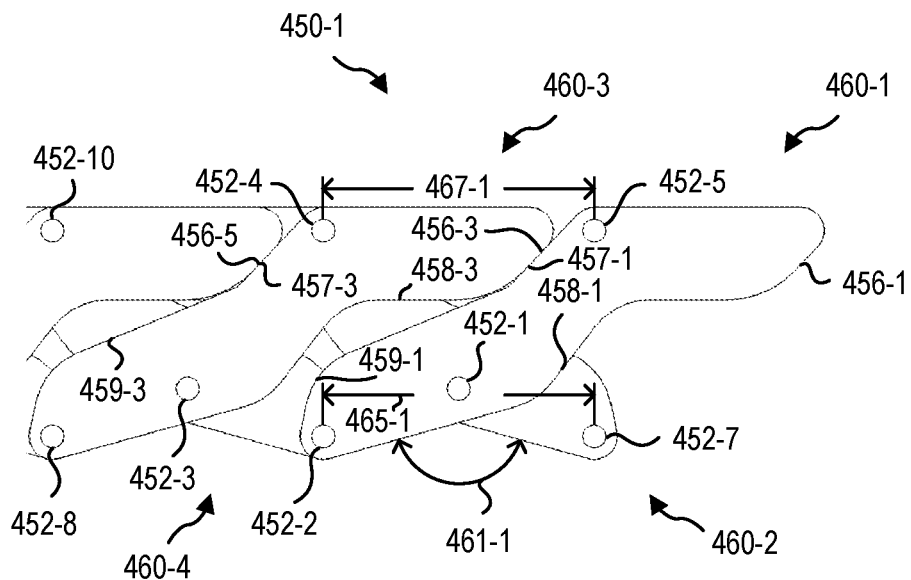
FIG. 12 is a cutaway side view of an implementation of a plurality of support elements in a planar configuration.
Figure 13:
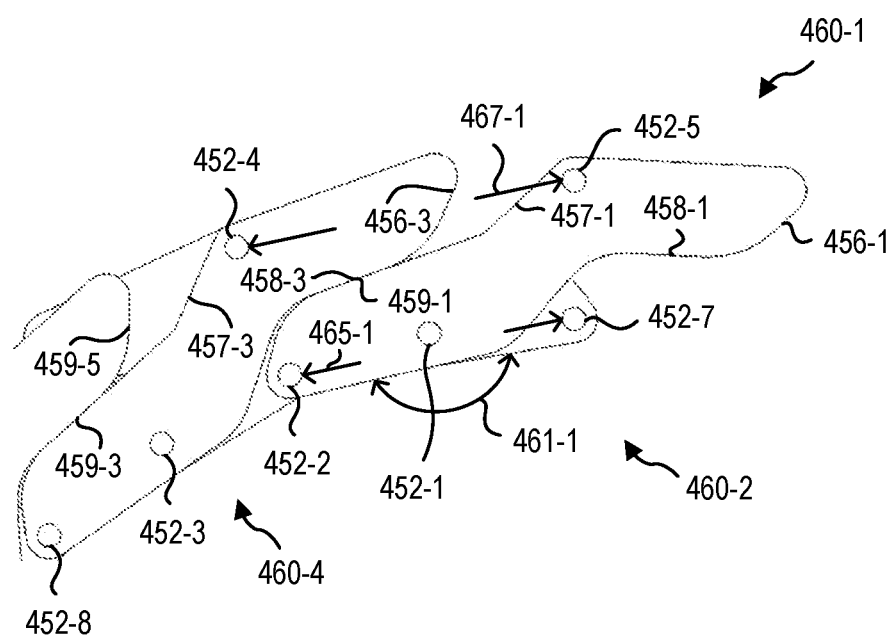
FIG. 13 is a cutaway side view of the plurality of support elements in a bent configuration.

FIG. 12 is a cutaway side view of an implementation of a plurality of support elements 460 in a planar configuration and FIG. 13 is a cutaway side view of the plurality of support elements 460 in a bent configuration. The plurality of support elements 460 may be similar to other implementations of support elements described herein (e.g., support elements 260, 360). One or more components of other support elements described herein may be incorporated into the present implementation.

The plurality of support elements 460 include a first support element 460-1, a second support element 460-2, a third support element 460-3, and a fourth support element 460-4. The plurality of support elements 460 may be interconnected by pivots 452. Links (not labeled) may extend between pivots 452. Pivots 452 may include pins, flexures, or other pivots. Support elements 460 may cooperate to form unit cells. For example, the first support element 460-1, the second support element 460-2, the third support element 460-3, and the fourth support element 460-4 may cooperate to form a first unit cell 450-1.

The first support element 460-1 is connected to the second support element 460-2 by a first pivot 452-1. The first support element 460-1 is connected to the fourth support element 460-4 by a second pivot 452-2. The third support element 460-3 is connected to the fourth support element 460-4 by a third pivot 452-3. The second support element 460-2 is connected to the third support element 460-3 by a fourth pivot 452-4.

The pivots 452 may be separated by distances (e.g., distances 465, 467) and/or angles (e.g., angle 461). A first angle 461-1 may be formed between the first support element 460-1 and the second support element 460-2 about the first pivot 452-1.

The first angle 461-1 may increase from the planar configuration of FIG. 12 and the bent configuration of FIG. 13. A first distance 465-1 may be formed between the second pivot 452-2 and a seventh pivot 452-7. A first distance 467-1 may be formed between the fourth pivot 452-4 and the fifth pivot 452-5.

Figure 14:
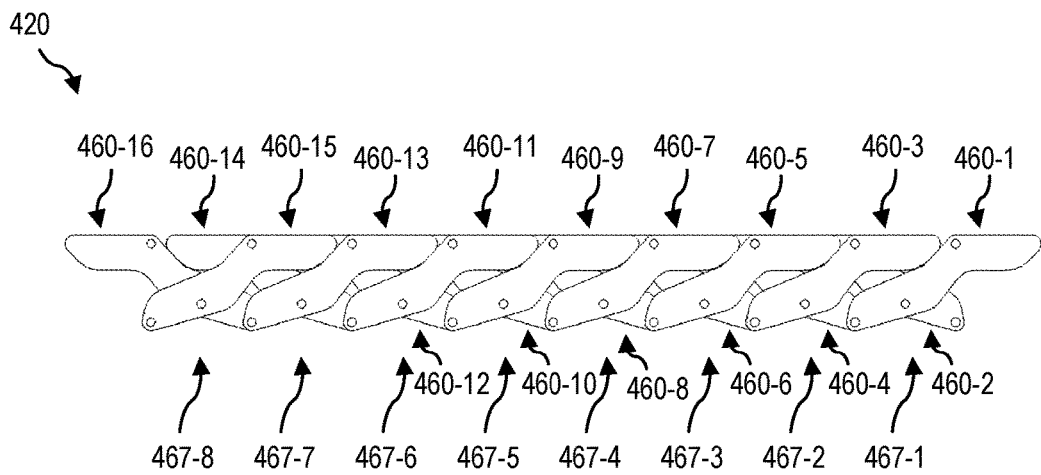
FIG. 14 is a side view of an implementation of a moveable display support incorporating the plurality of support elements of FIG. 12 in a planar configuration.
Figure 15:
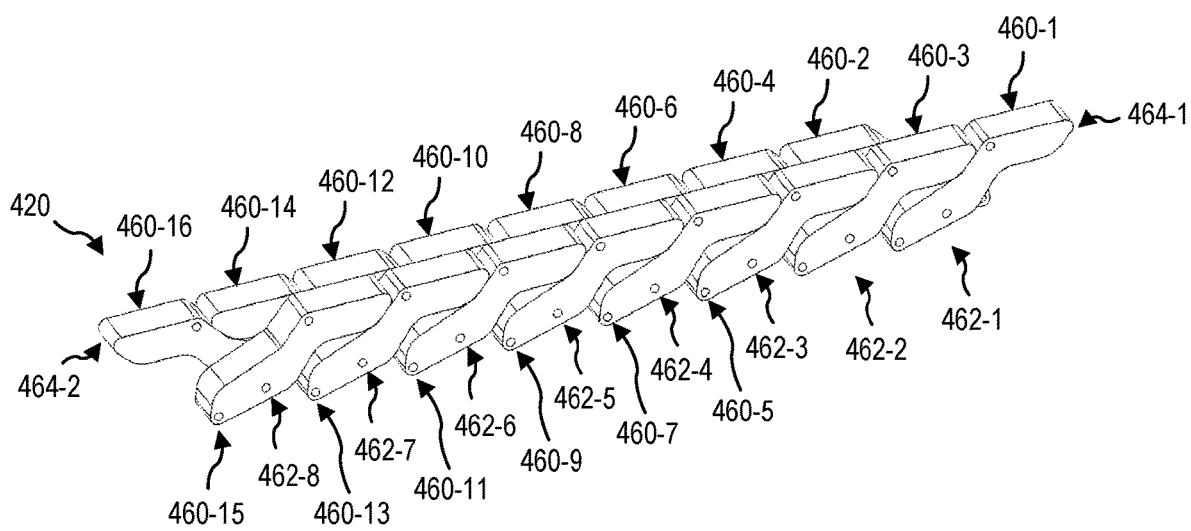
FIG. 15 is a perspective side view of the moveable display support of FIG. 14 in the planar configuration.
Figure 16:
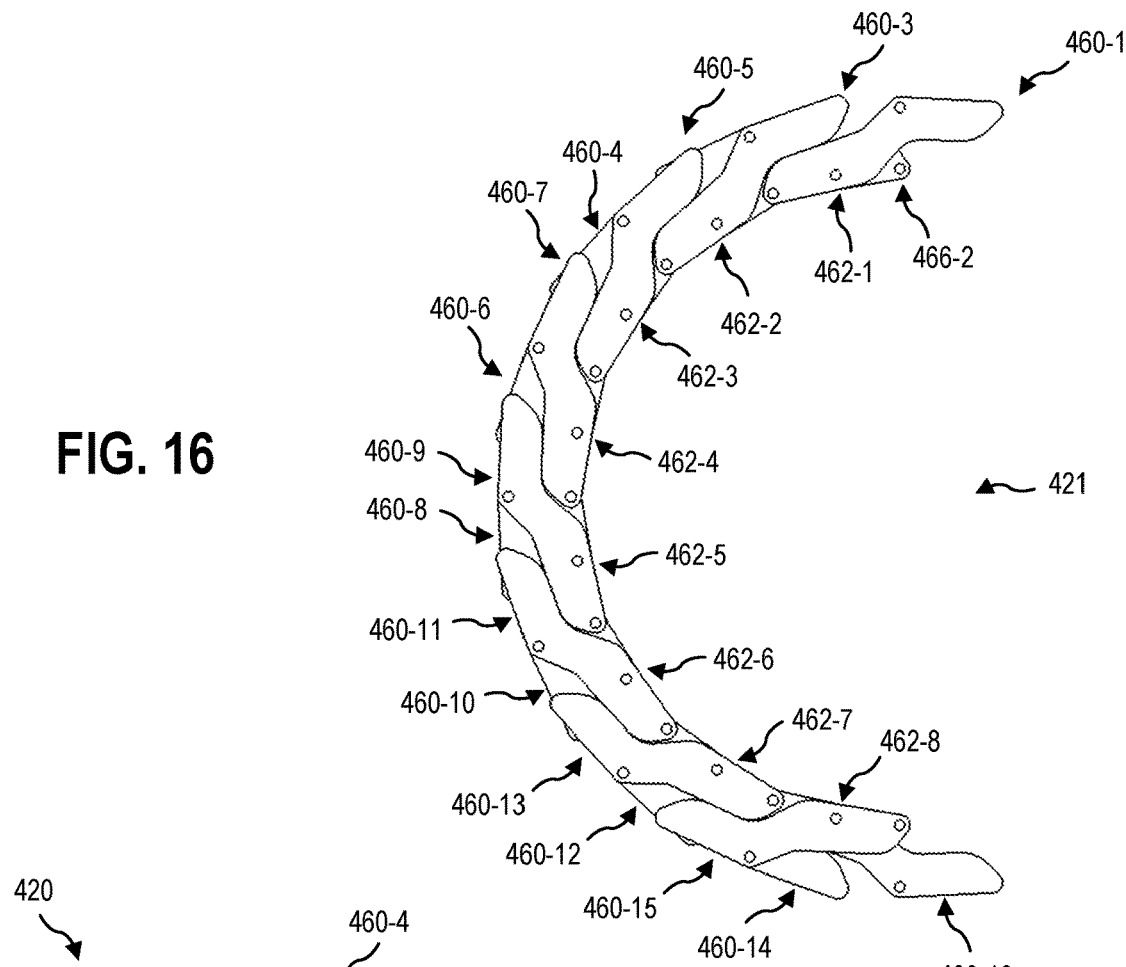
FIG. 16 is a side view of the moveable display support of FIG. 14 in a bent configuration.
Figure 17:
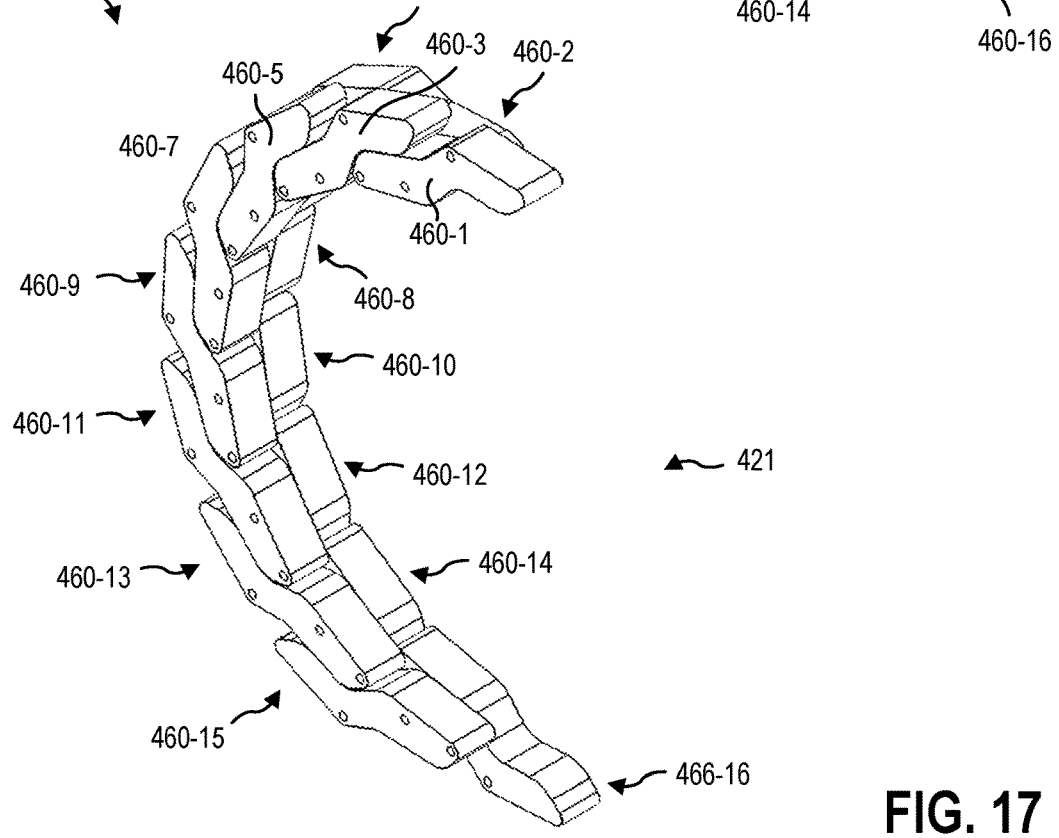
FIG. 17 is a perspective side view of the moveable display support of FIG. 14 in the bent configuration.

Similar to the implementation of a moveable display support 320 of FIGS. 7-11, the implementation of the moveable display support 420 of FIGS. 12-17 may be capable of limiting motion of display (e.g., displays 110, 210, 310) attached to the moveable display support 420 to prevent exceeding a first bend radius (e.g., the infinite bend radius of FIGS. 12 and 14-15), and may be capable of limiting motion of the display to prevent exceeding a second bend radius (e.g., the bend radius shown in the bent configurations of FIGS. 13 and 16-17). The ability to limit motion of the display in two directions without exceeding one or more bend radii of the display may be accomplished by using support elements (e.g., support elements 460) and/or unit cells (e.g., unit cells 450) that elongate during the bending process. In other words, a distance 465-1 between the second pivot 452-2 and the seventh pivot 452-7 may elongate from the first (e.g., planar) configuration to the second (e.g., bent configuration). In another example, as the moveable display support 420 transitions from the planar configuration of FIG. 7 to the bent configuration of FIG. 9, the angles (e.g., angle 461-1) between unit cells 450 may increase.

Support elements 460 may include stop surfaces 456, 457, 458, 459. Stop surfaces 456, 457, 458, 459 may cooperate to limit the motion (e.g., bending) of a moveable display support (e.g., moveable display support 420).

For example, in the planar configuration of FIG. 12, the stop surface 456-3 of the third support element 460-3 may abut the stop surface 457-1 of the first support element 460-1. In another example, in the bent configuration of FIG. 13, the stop surface 458-3 of the third support element 460-3 may abut the stop surface 459-1 of the first support element 460-1.

FIG. 14 is a side view of an implementation of a moveable display support 420 incorporating the plurality of support elements 460 of FIG. 12 in a planar configuration and FIG. 15 is a perspective side view of the moveable display support 420 of FIG. 14 in the planar configuration. Referring generally to FIGS. 14 and 15, the moveable display support 420 may include one or more rows 462 and/or one or more columns 464 of support elements 460. For example, the first row 462-1 may be formed through the first pivot 452-1 and may include the first support element 460-1 and the second support element 460-2. The moveable display support 420 may include eight rows 462-1, 462-2, 462-3, 462-4, 462-5, 462-6, 462-7, 462-8. In another example, the first column 464-1 may include the first support element 460-1, the third support element 460-3, the fifth support element 460-5, the seventh support element 460-7, the ninth support element 460-9, the eleventh support element 460-11, the thirteenth support element 460-13, and the fifteenth support element 460-15.

The moveable display support 420 may bend parallel to one or more rows 462. In other words, the moveable display support 420 may act as a hinge. In some implementations, the moveable display support 420 may only bend parallel to one or more rows 462. In other implementations, the moveable display support 420 may bend transversely to one or more rows 462. For instance, the moveable display support 420 may bend about lines and/or curves that are not parallel to one or more rows 462.

FIG. 16 is a side view of the moveable display support 420 of FIG. 14 in a bent configuration and FIG. 17 is a perspective side view of the moveable display support 420 of FIG. 14 in the bent configuration. In the planar configurations shown in FIGS. 14-15, the stop surfaces 456 may abut the stop surfaces 457. In the bent configurations of FIGS. 16-17, the stop surfaces 458 may abut the stop surfaces 459.

Figure 18:
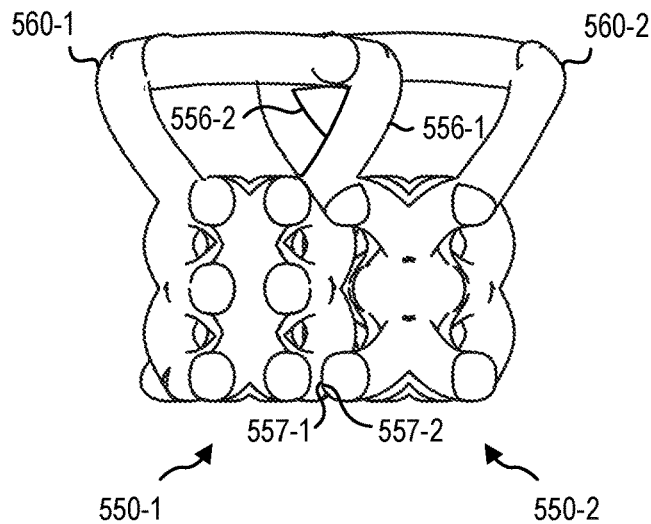
FIG. 18 is a front view of an implementation of a plurality of unit cells in a planar configuration.

FIG. 18 is a front view of an implementation of a plurality of unit cells 550 in a planar configuration. The unit cells 550 may include one or more support elements 560. The unit cells 550 may be interconnected. As shown in FIG. 18, a first support element 560-1 of the first unit cell 550-1 and a second support element 560-2 of the second unit cell 550-2 may be linked. In other words, a portion of the first support element 560-1 the first unit cell 550-1 may extend through a portion of the second support element 560-2 of the second unit cell 550-2. In another example, the first unit cell 550-1 may be linked to the second unit cell 550-2 in a manner similar to links of a chain. In other words, a first unit cell 550-1 may pivot relative to a second unit cell 550-2.

Linking unit cells 550 may allow for movement of between unit cells 550. The unit cells 550 may include stop surfaces 556, 557. As shown in FIG. 18, the stop surface 557-1 of the first unit cell 550-1 and the stop surface 557-2 of the second unit cell 550-1 may abut in a planar configuration. The stop surfaces 557 may limit movement of the unit cells 550. For example, the stop surfaces 557 may limit movement of the unit cells 550 from leaving the planar configuration.

Figure 25:
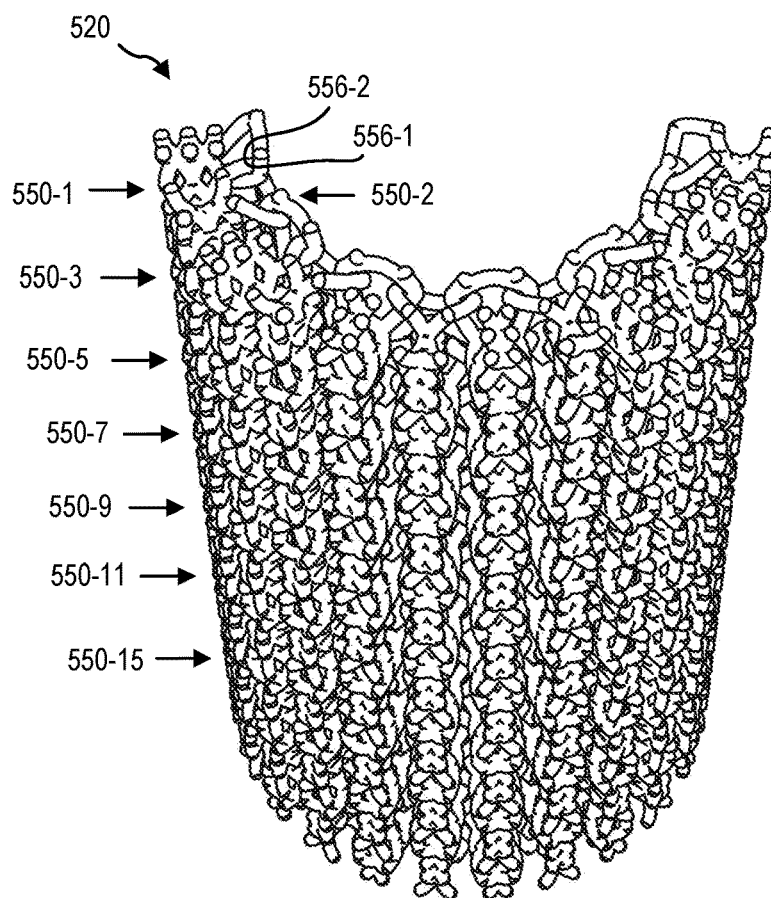
FIG. 25 is a perspective bottom view of the moveable display support of FIG. 21 in the bent configuration.

Referring briefly to FIG. 25, which will be described further below, which illustrates a first stop surface 556-1 of the first unit cell 550-1 abutting a second stop surface 556-2 of the second unit cell 550-2. This abutting relationship may limit movement of the first and second unit cells 550-1, 550-2. For example, as shown, the stop surfaces 556 may limit movement of the unit cells 550 to the second configuration (e.g., a bent configuration).

Figure 19:
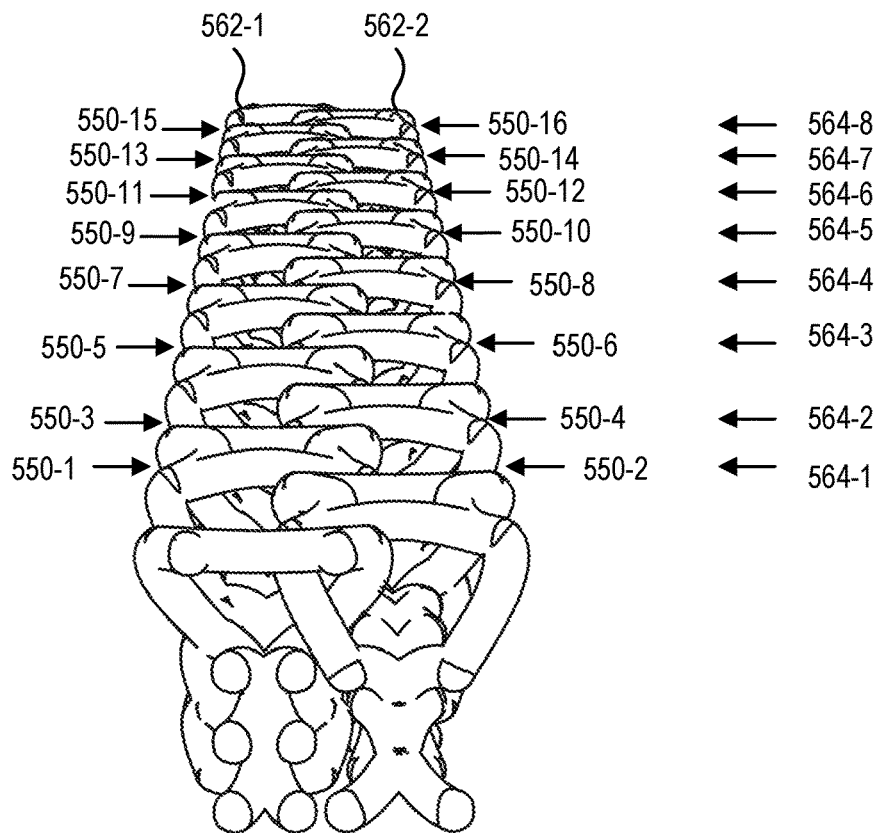
FIG. 19 is a perspective top view of a plurality of rows incorporating the plurality of unit cells of FIG. 18 in the planar configuration.

FIG. 19 is a perspective top view of a plurality of rows 562 incorporating the plurality of unit cells 550 of FIG. 18 in the planar configuration. As shown, the unit cells 550 are linked and stop surfaces (e.g., stop surfaces 557 shown in FIG. 18) abut to limit movement of the unit cells 550.

Figure 22:
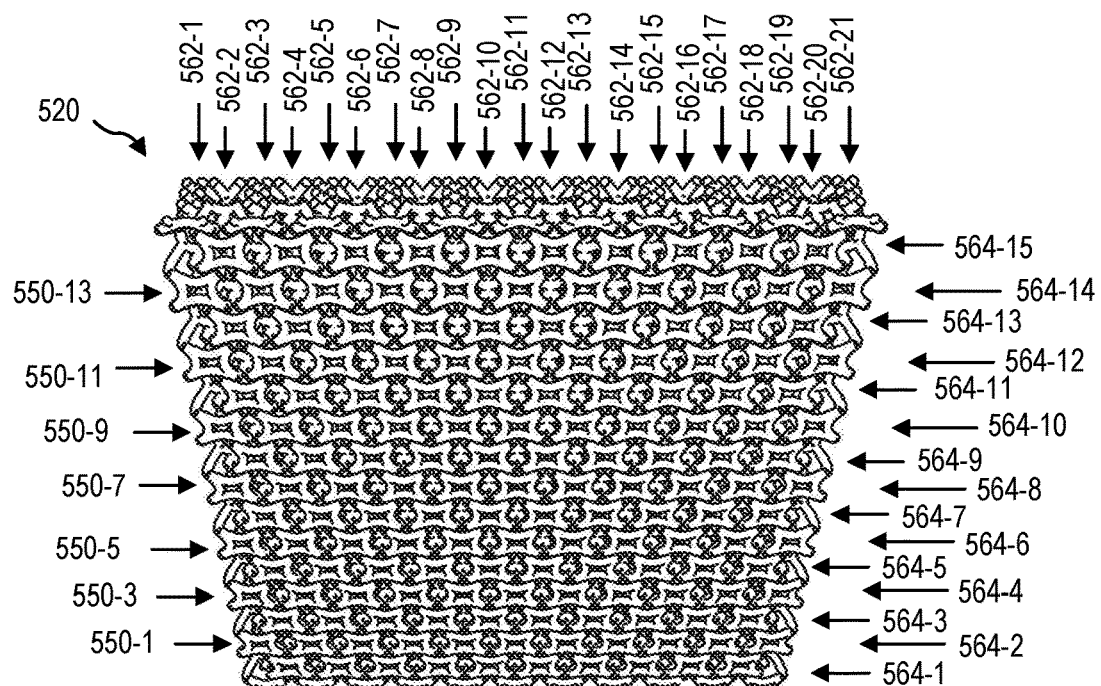
FIG. 22 is a perspective top view of an implementation of a moveable display support incorporating the plurality of interconnected rows of unit cells of FIG. 21 in the planar configuration.

The first unit cell 550-1 is in a first row 562-1 (with unit cells 550-3, 550-5, 550-7, 550-9, 550-11, 550-13, 550-15) and the second unit cell 550-2 is in a second row 562-2 (with unit cells 550-2, 550-4, 550-6, 550-8, 550-10, 550-12, 550-14, 550-16). The first unit cell 550-1 and the second unit cell 550-2 are in a first column 564-1 (with additional unit cells 550 as shown in FIG. 22). Additional unit cells 550 may be located in columns 564 (e.g., columns 564-1, 564-2, 564-3, 564-4, 564-5, 564-6, 564-7, 564-8).

The moveable display support 520 may bend parallel to one or more rows 562. In other words, the moveable display support 520 may act as a hinge. In some implementations, the moveable display support 520 may only bend parallel to one or more rows 562. In other implementations, the moveable display support 520 may bend transversely to one or more rows 562. For instance, the moveable display support 520 may bend about lines and/or curves that are not parallel to one or more rows 562.

Figure 20:
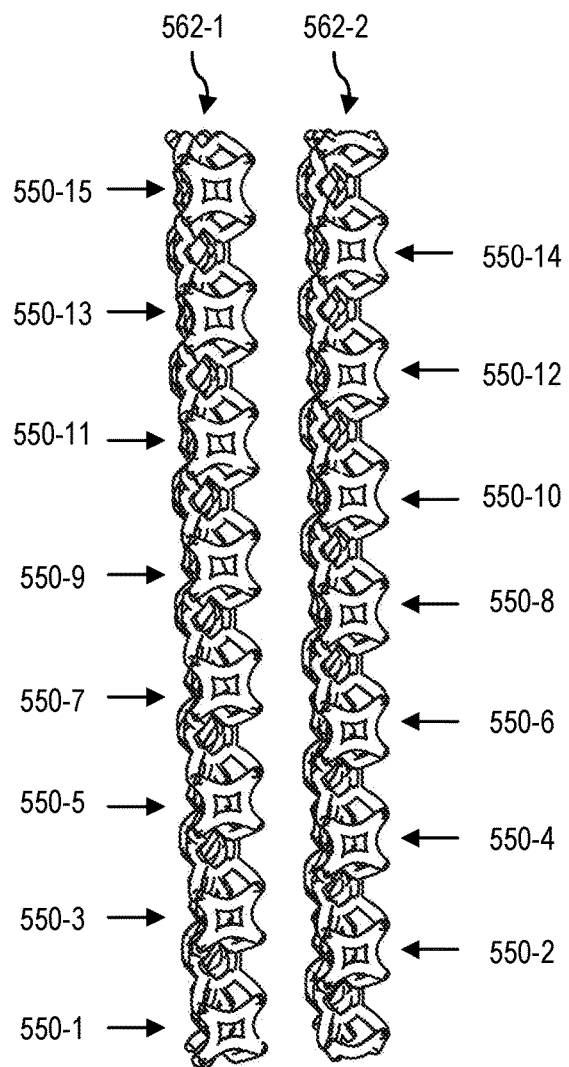
FIG. 20 is a top view of a plurality of separated rows of unit cells in the planar configuration.

FIG. 20 is a top view of a plurality of separated rows 562 of unit cells 550 in the planar configuration. In the present implementation, the unit cells 550 in each row 562 may be interconnected. In other words, the first unit cell 550-1 and the third unit cell 550-3 may be directly connected, integrally formed, unitarily constructed, or otherwise interconnected. The fifth unit cell 550-5, the seventh unit cell 550-7, the ninth unit cell 550-9, the eleventh unit cell 550-11, the thirteenth unit cell 550-13, and the fifteenth unit cell 550-15 may also be interconnected. The unit cells 550-2, 550-4, 550-6, 550-8, 550-10, 550-12, 550-14, 550-16 may also be interconnected.

In other implementations, fewer than all unit cells 550 in a row may be interconnected. For instance, first unit cell 550-1 and third unit cell 550-3 may be interconnected while third unit cell 550-3 is not interconnected with the fifth unit cell 550-5.

Figure 23:
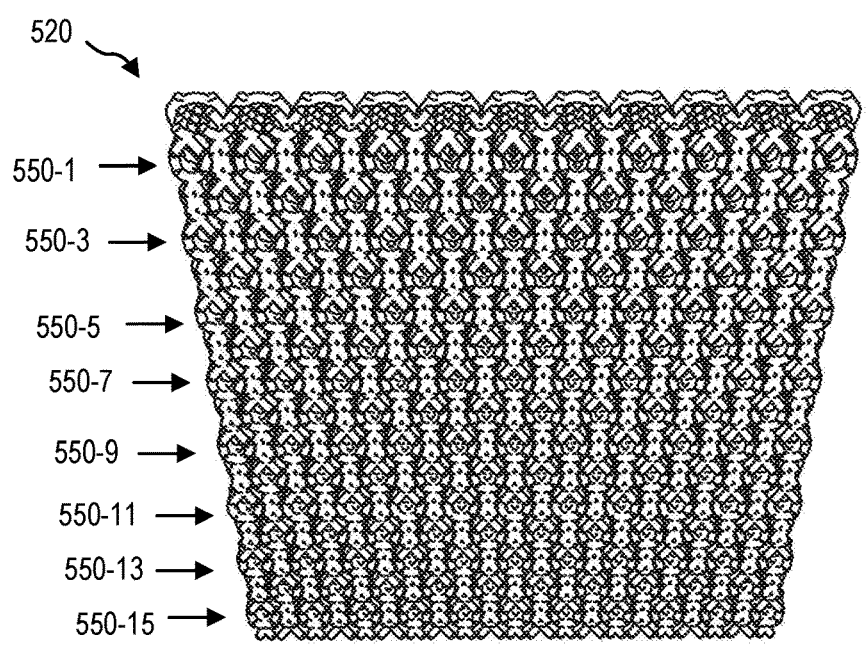
FIG. 23 is a perspective bottom view of the moveable display support of FIG. 21 in the planar configuration.
Figure 24:
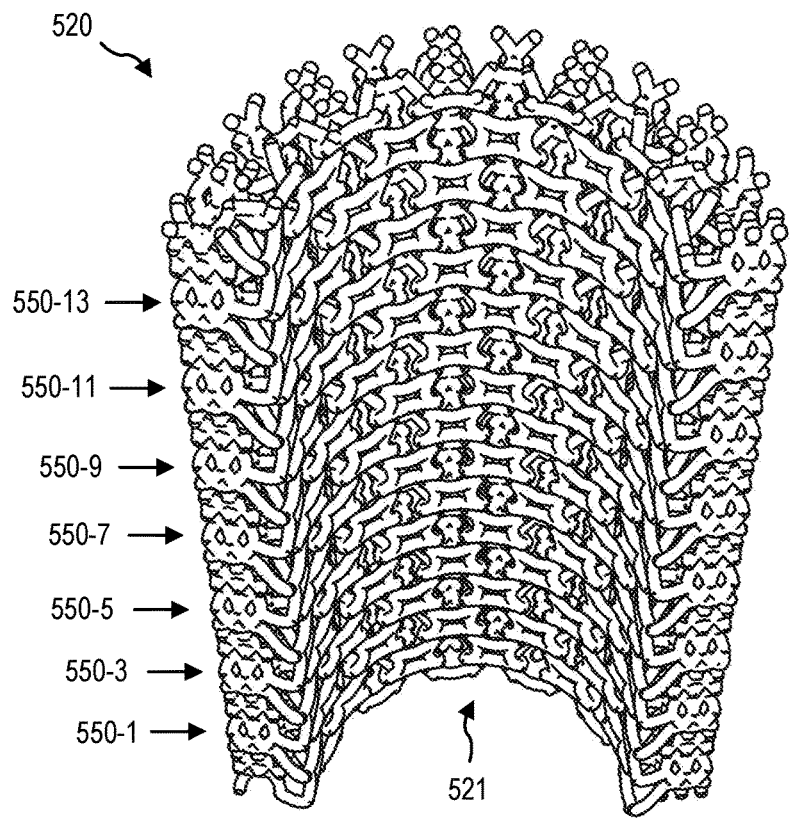
FIG. 24 is a perspective top view of the moveable display support of FIG. 21 in a bent configuration.

Similar to the implementations of a moveable display support 320, 420 of FIGS. 7-11 and 12-17, the implementation of the moveable display support 520 of FIGS. 18-25 may be capable of limiting motion of display (e.g., displays 110, 210, 310) attached to the moveable display support 520 to prevent exceeding a first bend radius (e.g., the infinite bend radius of FIGS. 22-23), and may be capable of limiting motion of the display to prevent exceeding a second bend radius (e.g., the bend radius shown in the bent configurations of FIGS. 24-25). The ability to limit motion of the display in two directions without exceeding one or more bend radii of the display may be accomplished by using support elements (e.g., support elements 560) and/or unit cells (e.g., unit cells 550) that elongate during the bending process. In other words, a distance (not labeled) between the first stop surface 557-1 and the second stop surface 557-2 may elongate from the first (e.g., planar) configuration (where the distance is zero) to the second (e.g., bent configuration). In another example, as the moveable display support 520 transitions from the planar configuration of FIGS. 22-23 to the bent configuration of FIGS. 24-25, the angles (not labeled) between unit cells 550 may increase.

Figure 21:
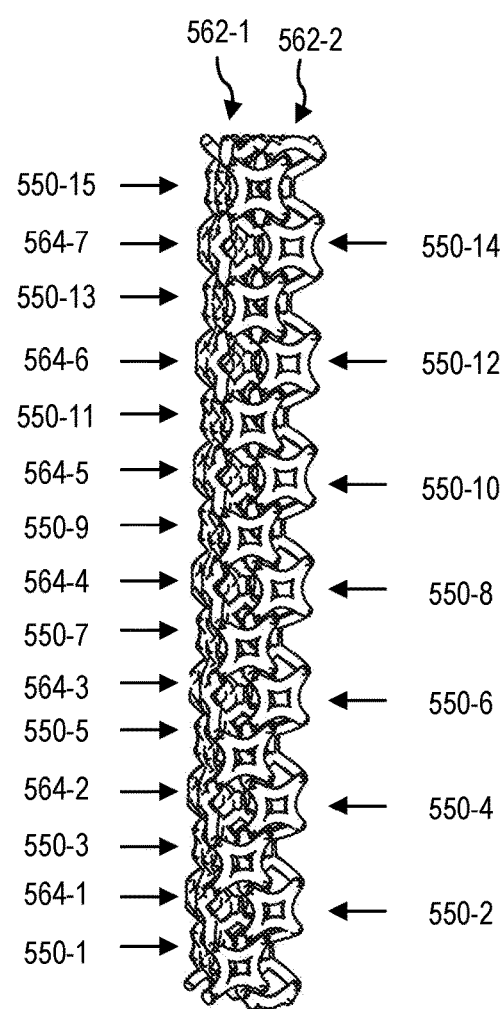
FIG. 21 is a top view of a plurality of interconnected rows of unit cells in the planar configuration.

FIG. 21 is a top view of the plurality of interconnected rows 562 of unit cells 550 of FIG. 20 in the planar configuration. The first row 562-1 and the second row 562-2 may also be interconnected. The unit cells 550 of the first row 562-1 may be interconnected both to each other and to the unit cells 550 of the second row 562-2. For example, the unit cells 550 of the first row 562-1 may be directly connected together, as described herein, while the unit cells 550 of the first row 562-1 may be linked to the unit cells 550 of the second row 562-2. In another example, the unit cells 550 of the rows 562 may not be directly connected together, but may interconnect with the unit cells 550 of one or more other rows 562.

FIG. 22 is a perspective top view of an implementation of a moveable display support 520 incorporating the plurality of interconnected rows 562 and columns 564 of unit cells 550 of FIG. 21 in the planar configuration and FIG. 23 is a perspective bottom view of the moveable display support 520 of FIG. 21 in the planar configuration. As shown, the unit cells 550 in rows 562 and columns 564 are linked.

The unit cells 550 may include stop surfaces (e.g., stop surfaces 556, 557). One or more stop surfaces may limit movement of the moveable display support 520 beyond the planar configuration. In other words, as shown in FIG. 23, the stop surfaces may prevent bending of the bottom surface (not labeled) of the moveable display support 520 beyond the planar configuration. In other implementations, the unit cells 550 may be designed for a different bend radius (e.g., other than an infinite bend radius in the first, planar configuration).

FIG. 24 is a perspective top view and FIG. 25 is a perspective bottom view of the moveable display support 520 of FIG. 21 in the bent configuration. As shown, the unit cells 550 in rows 562 and columns 564 remain linked.

The unit cells 550 may include stop surfaces (e.g., stop surfaces 556, 557). One or more stop surfaces may limit movement of the moveable display support 520 beyond the bent configuration. In other words, as shown in FIG. 24, the stop surfaces may prevent bending of the top surface (not labeled) of the moveable display support 520 beyond the bent configuration. In other words, the stop surfaces may limit bending of the top surface to a predetermined bend radius. In other implementations, the unit cells 550 may be designed for a different bend radius (e.g., an infinite bend radius like the first, planar configuration).

Figure 26:
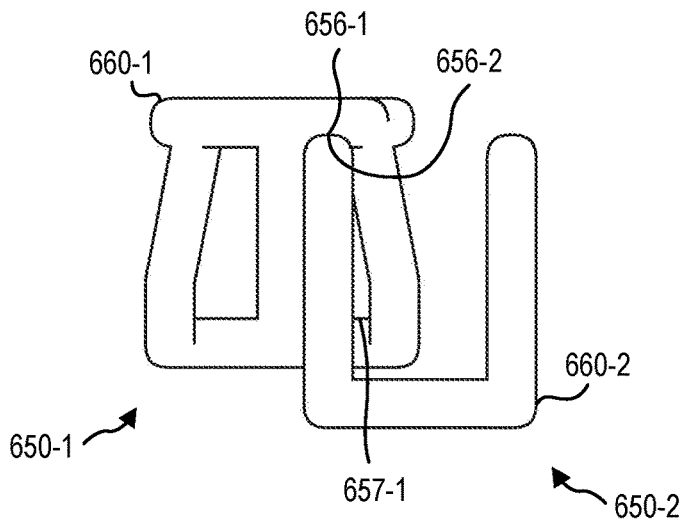
FIG. 26 is a front view of an implementation of a plurality of unit cells in a planar configuration.

FIG. 26 is a front view of an implementation of a plurality of unit cells 650 in a planar configuration. The unit cells 650 may include one or more support elements 660. The unit cells 650 may be interconnected. As shown in FIG. 26, a first support element 660-1 of the first unit cell 650-1 and a second support element 660-2 of the second unit cell 650-2 may be linked. In other words, a first unit cell 650-1 may pivot relative to a second unit cell 650-2.

Figure 30:
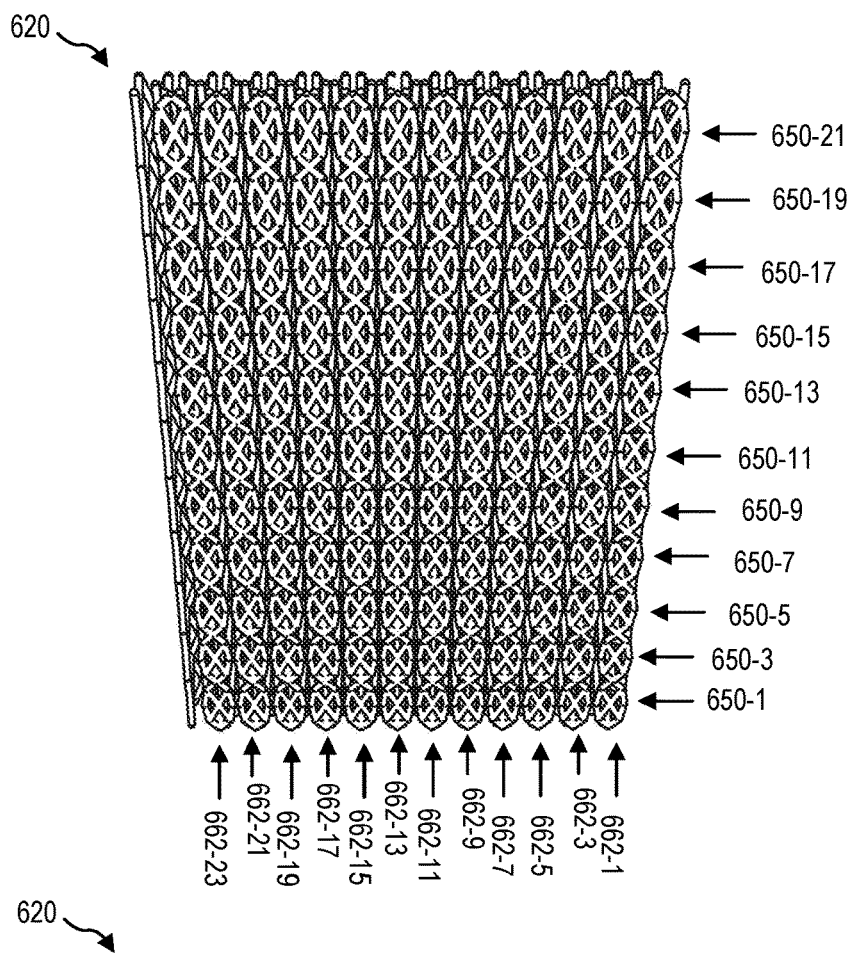
FIG. 30 is a perspective top view of an implementation of a moveable display support incorporating the plurality of interconnected rows of unit cells of FIG. 29 in the planar configuration.
Figure 31:
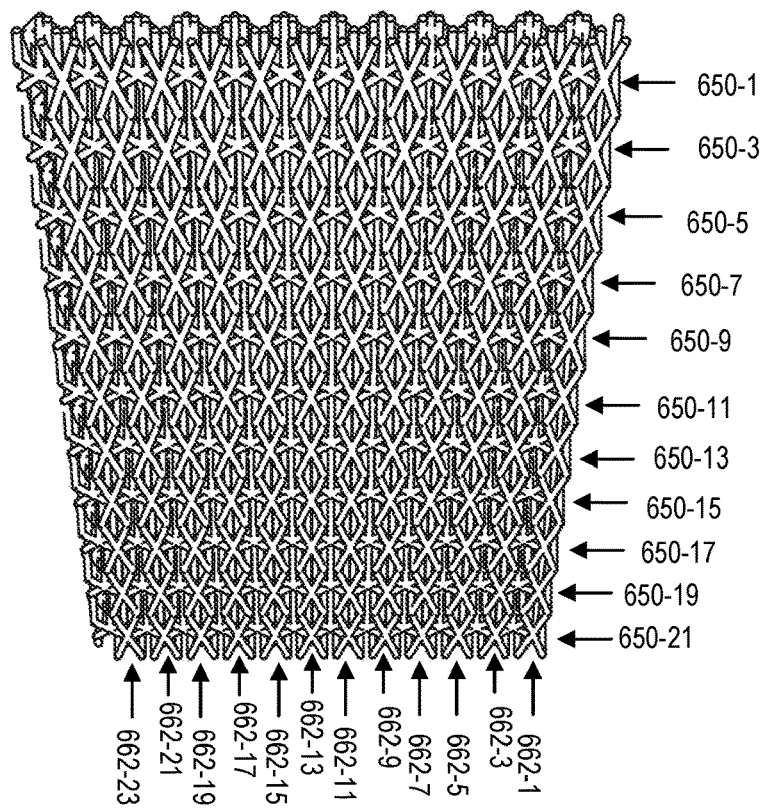
FIG. 31 is a perspective bottom view of the moveable display support of FIG. 29 in the planar configuration.
Figure 32:
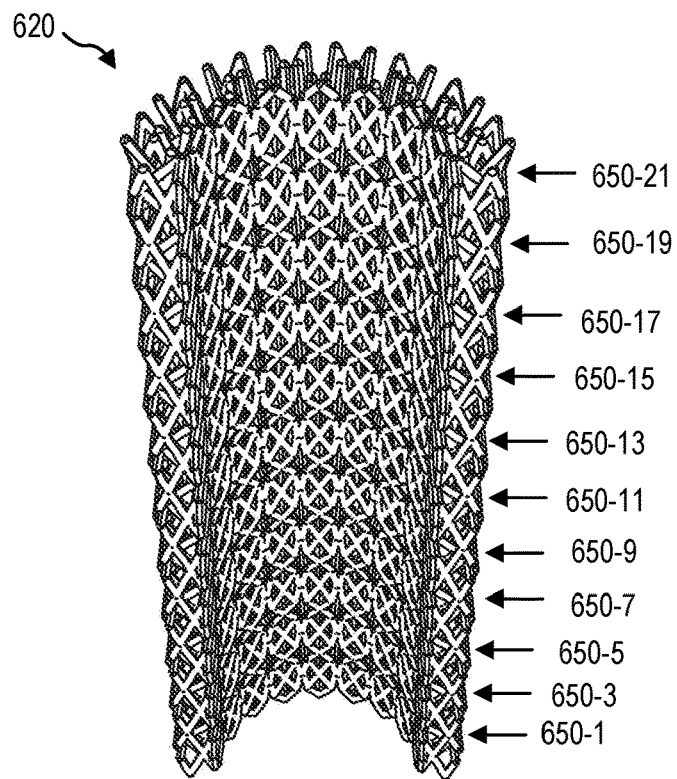
FIG. 32 is a perspective top view of the moveable display support of FIG. 29 in a bent configuration.
Figure 33:
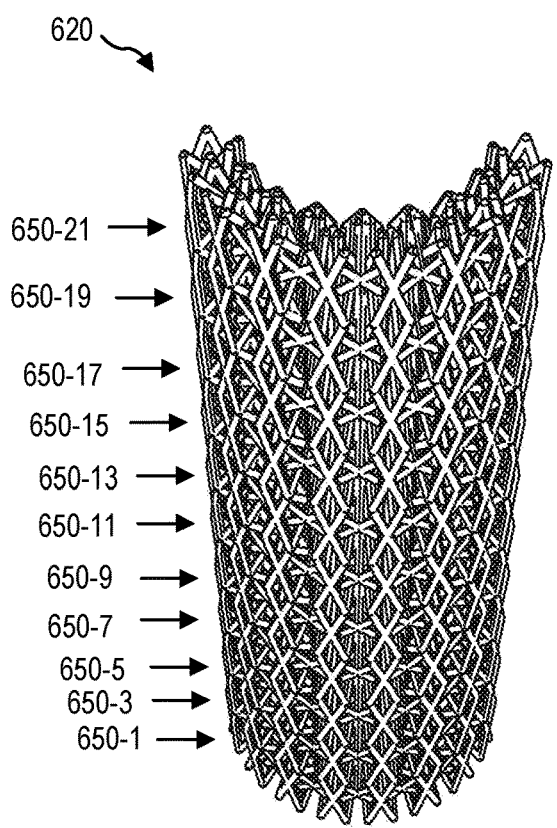
FIG. 33 is a perspective bottom view of the moveable display support of FIG. 28 in the bent configuration.

Similar to the implementations of a moveable display support 320, 420, 520, of FIGS. 7-11, 12-17, and 18-25, the implementation of the moveable display support 620 of FIGS. 26-33 may be capable of limiting motion of display (e.g., displays 110, 210, 310) attached to the moveable display support 620 to prevent exceeding a first bend radius (e.g., the infinite bend radius of FIGS. 30-31), and may be capable of limiting motion of the display to prevent exceeding a second bend radius (e.g., the bend radius shown in the bent configurations of FIGS. 32-33). The ability to limit motion of the display in two directions without exceeding one or more bend radii of the display may be accomplished by using support elements (e.g., support elements 660) and/or unit cells (e.g., unit cells 650) that elongate during the bending process. In other words, a distance (not labeled) between the first stop surface 657-1 and the second stop surface 656-2 may elongate from the first (e.g., planar) configuration (where the distance is zero) to the second (e.g., bent configuration). In another example, as the moveable display support 620 transitions from the planar configuration of FIGS. 30-31 to the bent configuration of FIGS. 32-33, the angles (not labeled) between unit cells 650 may increase.

The unit cells 650 may include stop surfaces 656, 657. As shown in FIG. 26, the stop surface 656-1 of the first unit cell 650-1 and the stop surface 656-2 of the second unit cell 650-1 may abut in a planar configuration.

Referring briefly to FIG. 21, which will be described further below, which illustrates abutting relationships between unit cells 650. These abutting relationships may limit movement of the unit cells 650.

Figure 27:
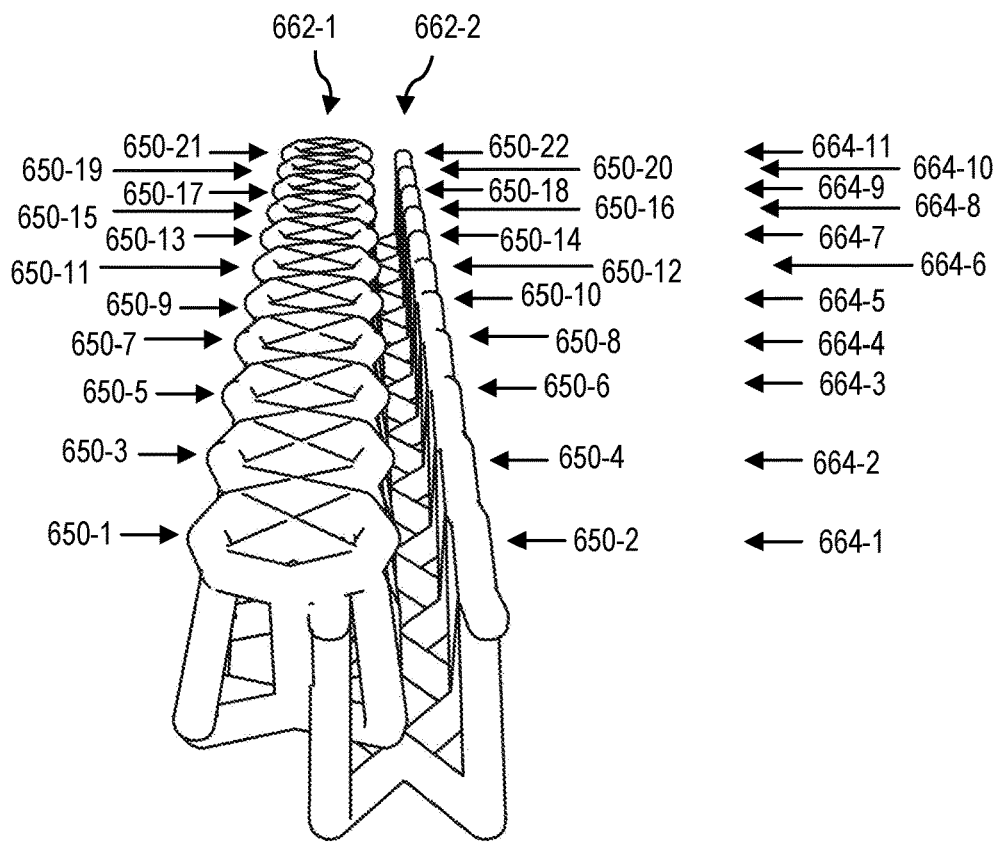
FIG. 27 is a perspective top view of a plurality of rows incorporating the plurality of unit cells of FIG. 26 in the planar configuration.

FIG. 27 is a perspective top view of a plurality of rows 662 incorporating the plurality of unit cells 650 of FIG. 26 in the planar configuration. As shown, the unit cells 650 are linked and stop surfaces (e.g., stop surfaces 657 shown in FIG. 26) abut to limit movement of the unit cells 650.

The first unit cell 650-1 is in a first row 662-1 (with unit cells 650-3, 650-5, 650-7, 650-9, 650-11, 650-13, 650-15, 650-17, 650-19, 650-21) and the second unit cell 650-2 is in a second row 662-2 (with unit cells 650-2, 650-4, 650-6, 650-8, 650-10, 650-12, 650-14, 650-16, 650-18, 650-20, 650-22). The first unit cell 650-1 and the second unit cell 650-2 are in a first column 664-1 (with additional unit cells 650 as shown in FIG. 30). Additional unit cells 650 may be located in columns 664 (e.g., columns 664-1, 664-2, 664-3, 664-4, 664-5, 664-6, 664-7, 664-8).

The moveable display support 620 may bend parallel to one or more rows 662. In other words, the moveable display support 620 may act as a hinge. In some implementations, the moveable display support 620 may only bend parallel to one or more rows 662. In other implementations, the moveable display support 620 may bend transversely to one or more rows 662. For instance, the moveable display support 620 may bend about lines and/or curves that are not parallel to one or more rows 662.

FIG. 28 is a top view of a plurality of separated rows 662 of unit cells 650 in the planar configuration. In the present implementation, the unit cells 650 in each row 662 may be interconnected. In other words, the first unit cell 650-1 and the third unit cell 650-3 may be directly connected, integrally formed, unitarily constructed, or otherwise interconnected. The fifth unit cell 650-5, the seventh unit cell 650-7, the ninth unit cell 650-9, the eleventh unit cell 650-11, the thirteenth unit cell 650-13, the fifteenth unit cell 650-15, the seventeenth unit cell 650-17, the nineteenth unit cell 650-19, and the twenty-first unit cell 650-21 may also be interconnected. The unit cells 650-2, 650-4, 650-6, 650-8, 650-10, 650-12, 650-14, 650-16, 650-18, 650-20 may also be interconnected.

In other implementations, fewer than all unit cells 650 in a row may be interconnected. For instance, first unit cell 650-1 and third unit cell 650-3 may be interconnected while third unit cell 650-3 is not interconnected with the fifth unit cell 650-5.

FIG. 29 is a top view of a plurality of interconnected rows 662 of unit cells 650 in the planar configuration. The first row 662-1 and the second row 662-2 may also be interconnected. The unit cells 650 of the first row 662-1 may be interconnected both to each other and to the unit cells 650 of the second row 662-2.

FIG. 30 is a perspective top view of an implementation of a moveable display support 620 incorporating the plurality of interconnected rows 662 of unit cells 650 of FIG. 29 in the planar configuration and FIG. 31 is a perspective bottom view of the moveable display support 620 of FIG. 29 in the planar configuration. As shown, the unit cells 650 in rows 662 and columns 664 are linked.

The unit cells 650 may include stop surfaces (e.g., stop surfaces 656, 657). One or more stop surfaces may limit movement of the moveable display support 620 beyond the planar configuration. In other words, as shown in FIG. 30, the stop surfaces may prevent bending of the top surface (not labeled) of the moveable display support 620 beyond the planar configuration. In other implementations, the unit cells 650 may be designed for a different bend radius (e.g., other than an infinite bend radius in the first, planar configuration).

FIG. 32 is a perspective top view and FIG. 33 is a perspective bottom view of the moveable display support 620 of FIG. 28 in the bent configuration. As shown, the unit cells 650 in rows 662 and columns 664 remain linked.

The unit cells 650 may include stop surfaces (e.g., stop surfaces 656, 657). One or more stop surfaces may limit movement of the moveable display support 620 beyond the bent configuration. In other implementations, the unit cells 650 may be designed for a different bend radius (e.g., an infinite bend radius like the first, planar configuration).

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing device, comprising:
a flexible display including a thin film transistor matrix having a front surface and a back surface; and
a moveable display support connected to the back surface of the display at a plurality of attachment points that are spaced about the back surface of the flexible display including a bending portion of the flexible display and the moveable display support configured to limit bending in one direction to a first bend radius while maintaining strain on the thin film transistor matrix below a predetermined amount of strain by elongating the moveable display support during bending, the moveable display support elongating by creating a first distance between a first attachment point of the plurality of attachment points and a second adjacent attachment point of the plurality of attachment points and by creating a second distance between the second attachment point of the plurality of attachment points and a third adjacent attachment point of the plurality of attachment points in a bent configuration, wherein the first distance is larger in the bent configuration than in a planar configuration and the second distance is larger in the bent configuration than in the planar configuration.

2. The computing device of claim 1, wherein the moveable display support includes a plurality of interlocking elements.

3. The computing device of claim 1, wherein the moveable display support extends between a first edge of the flexible display and a second edge of the flexible display.

4. The computing device of claim 1, wherein the flexible display has a dimension from a first edge to a second edge and wherein the moveable display support extends from within five percent of the dimension of the first edge of the flexible display to within five percent of the dimension of the second edge of the flexible display.

5. The computing device of claim 1, wherein the moveable display support extends from a first edge of the flexible display to a second edge of the flexible display.

6. The computing device of claim 1, wherein the moveable display support is attached to the back surface of the flexible display.

7. The computing device of claim 1, wherein the flexible display includes a layer adjacent one or more front layers, and one or more back layers, to form a stack.

8. The computing device of claim 7, wherein the stack is foldable between infinite radius to a radius of 2 mm without additional support.

9. The computing device of claim 8, wherein the moveable display support and the flexible display cooperate to reduce the radius to which the stack is foldable by 1 mm.

10. The computing device of claim 1, wherein the moveable display support is formed of a material having sufficient hardness to prevent strain above 0.5% of the predetermined amount of strain.

11. The computing device of claim 1, wherein the moveable display support is formed by additive manufacturing.

12. The computing device of claim 1, wherein the first attachment point, the second attachment point, and the third attachment point are in a row.

13. A computing device, comprising:
a flexible display having a front surface and a back surface; and
a moveable display support connected to the back surface of the display at a plurality of attachment points that are spaced about the back surface of the flexible display including a bending portion of the flexible display, the moveable display support formed by a plurality of unit cells, wherein a first unit cell of the plurality of unit cells and an adjacent second unit cell of the plurality of unit cells in a row are linked, each unit cell attached to the flexible display.

14. The computing device of claim 13, wherein the moveable display support includes a second unit cell.

15. The computing device of claim 14, wherein the second unit cell is connected to the first unit cell.

16. The computing device of claim 13, the plurality of unit cells extends in rows and columns.

17. The computing device of claim 16, wherein a third row of unit cells of the plurality of unit cells and the second row of unit cells of the plurality of unit cells are interconnected.

18. The computing device of claim 16, wherein a third row of unit cells of the plurality of unit cells and the second row of unit cells of the plurality of unit cells are linked.

19. The computing device of claim 16, wherein a third row of unit cells of the plurality of unit cells and the second row of unit cells of the plurality of unit cells are pinned.

20. The computing device of claim 16, wherein a third row of unit cells of the plurality of unit cells and the second row of unit cells of the plurality of unit cells are directly connected.

21. The computing device of claim 13, wherein each unit cell is attached to the flexible display at a single attachment point.

22. A computing device, comprising:
   an organic light-emitting diode (OLED) display including a thin film transistor matrix having a front surface and a back surface; and
   a moveable display support connected to the back surface of the display and configured to limit bending in one direction to a first bend radius and to limit bending in another direction to a second bend radius, the moveable display support formed by a plurality of unit cells, the moveable display support including a plurality of interlocking elements, wherein the OLED display has a dimension from a first edge to a second edge and wherein the moveable display support extends from within five percent of the dimension of the first edge of the OLED display to within five percent of the dimension of the second edge of the OLED display, wherein the moveable display support is attached to the back surface of the OLED display at a plurality of attachment points that are spaced about the back surface of the OLED display including a bending portion of the OLED display, the moveable display support elongating by creating a first distance between a first attachment point of the plurality of attachment points and a second adjacent attachment point of the plurality of attachment points and by creating a second distance between the second attachment point of the plurality of attachment points and a third adjacent attachment point of the plurality of attachment points in a bent configuration, wherein the first distance is larger in the bent configuration than in a planar configuration.

\* \* \* \* \*